US009261562B2

(12) United States Patent
Lee et al.

(10) Patent No.: US 9,261,562 B2
(45) Date of Patent: Feb. 16, 2016

(54) PORTABLE SYSTEM FOR IMMOTIVE MULTIPHASIC MOTIVE FORCE ELECTRICAL MACHINE TESTING

(75) Inventors: Sang Bin Lee, Seoul (KR); Ernesto Wiedenbrug, Fort Collins, CO (US)

(73) Assignee: SKF USA, Inc., Norristown, PA (US)

( * ) Notice: Subject to any disclaimer, the term of this patent is extended or adjusted under 35 U.S.C. 154(b) by 340 days.

(21) Appl. No.: 13/122,542

(22) PCT Filed: Oct. 4, 2008

(86) PCT No.: PCT/US2008/078875
§ 371 (c)(1),
(2), (4) Date: Apr. 4, 2011

(87) PCT Pub. No.: WO2010/039153
PCT Pub. Date: Apr. 8, 2010

(65) Prior Publication Data
US 2011/0191034 A1    Aug. 4, 2011

(51) Int. Cl.
*G01R 31/34* (2006.01)
*H02P 29/02* (2006.01)

(52) U.S. Cl.
CPC ............ *G01R 31/343* (2013.01); *H02P 29/021* (2013.01)

(58) Field of Classification Search
CPC ............................. H02P 29/021; G01R 31/343
USPC ................................................ 702/35, 57–60
See application file for complete search history.

(56) References Cited

U.S. PATENT DOCUMENTS

| | | | |
|---|---|---|---|
| 3,861,025 A * | 1/1975 | Sims ................................ 29/593 |
| 5,049,815 A * | 9/1991 | Kliman .......................... 324/545 |
| 5,455,776 A | 10/1995 | Novosel |
| 5,479,086 A | 12/1995 | Konstanzer |
| 5,521,482 A * | 5/1996 | Lang .................... G01R 31/343 |
| | | | 318/800 |
| 5,629,870 A * | 5/1997 | Farag et al. .................... 700/286 |
| 5,689,169 A * | 11/1997 | Kerkman et al. ............. 318/807 |
| 5,951,903 A * | 9/1999 | Isoyama et al. .............. 219/603 |
| 6,144,924 A | 11/2000 | Dowling et al. |
| 6,459,276 B1 * | 10/2002 | Matthews et al. ............. 324/545 |
| 6,529,135 B1 * | 3/2003 | Bowers et al. ................ 340/648 |

(Continued)

OTHER PUBLICATIONS

Yazidi, Amine; Henao, Humberto; Capolino, Gerard-Andre; "Broken Rotor Bars Fault Detection in Squirrel Cage Induction Machines," Department of Electrical Engineering, University of Picardie, France, 0-7803-8987-5/05.

(Continued)

*Primary Examiner* — Alexander Satanovsky
(74) *Attorney, Agent, or Firm* — Santangelo Law Offices, P. C.

(57) ABSTRACT

A portable test device (1) can be configured as a rotor conductivity anomaly tester, a magnetic core anomaly tester, or a rotational eccentricity fault tester for a multiphasic motive force electrical machine (6) by providing an immotive multiphasic motive force electrical machine test signal from a plurality of multiphasic motive force electrical machine signal generators (4) through a detachable electrical power connectivity (2) and by having a multiphasic motive force electrical machine fault analyzer (16) that can sense responses and discern the existence of a fault. Control of the test signal can be accomplished by an immotive multiphasic test signal controller (3) that varies frequency and achieves incremental movement or to achieve stator magnetization plane angle changes or movement that tests angular relationships.

27 Claims, 10 Drawing Sheets

(56) References Cited

U.S. PATENT DOCUMENTS

| | | | |
|---|---|---|---|
| 6,774,664 B2* | 8/2004 | Godbersen | 324/545 |
| 6,794,884 B2* | 9/2004 | Kliman et al. | 324/545 |
| 6,822,415 B1* | 11/2004 | Komiya et al. | 318/629 |
| 6,847,224 B2 | 1/2005 | Lee et al. | |
| 7,382,138 B1* | 6/2008 | Umans | 324/545 |
| 7,598,751 B2 | 10/2009 | Collins et al. | |
| 7,791,303 B2* | 9/2010 | Furman | 318/541 |
| 2009/0273336 A1* | 11/2009 | Wolfe et al. | 324/76.11 |
| 2010/0026312 A1* | 2/2010 | Buxkemper et al. | 324/547 |
| 2010/0060289 A1 | 3/2010 | Wiedenbrug et al. | |

OTHER PUBLICATIONS

Watson, J.F.; Paterson, N.C.; "Improved Techniques for Rotor Fault Detection in Three-Phase Induction Motors," School of Electronic and Electrical Engineering, Aberdeen U.K.; 0-7803-4943-1/98.

Mirafzal, Behrooz; Demerdash, A.O.; "Effects of Load on Diagnosing Broken Bar Faults in Induction Motors Using the Pendulous Oscillation of the Rotor Magnetic Field Orientation," Deparatment of Electrical and computer Engineering, Marquette University; 0-7803-8486-5/04.

Yazici, Birsen; Kliman, Gerald; "An Adaptive Statistical Time-Frequency Method for Detection of Broken Bars and Bearing Faults in Motors Using Stator Current," 0093-9994/99; 1999 IEEE Transactions on Industry Applications, vol. 35, No. 2, Mar./Apr. 1999.

Drif, M'Hamed; Benouzza, N; Kraloua, B; Bendiabdellah, A; Dente, J.A.; "Squirrel Cage Rotor Faults Detection in Induction Motor Utilizing Stator Power Spectrum Approach," Power Electronics, Machines and Drives, Apr. 2002, Conference Publication No. 487.

Hurst, K.D.; Habetler, T.G.; Griva, G; Profumo, F; "Speed Sensorless Field-Oriented Control of Induction Machines Using Current Harmonic Spectral Estimation," 0-7803-1993-1/94.

Hurst, K.D.; Habetler; "A Comparison of Spectrum Estimation Techniques for Sensorless Speed Detection in Induction Machines," 0-7803-3008-0/95, 1995 IEEE, Georgia Institute of Technology, School of Electrical Engineering.

Brudny, J.F.; Roger, D; "Induction Machine Speed Sensor Based on Stator Current Measurement," Power Electronics and Variable Speed Drives, Conference Publication No. 429, Sep. 1996.

Pillay, P; Xu, Z; "Motor Current Signature Analysis," Clarkson University, ECE Dept., Potsdam, NY; 0-7803-3544-9/96.

Nandi, S; Ahmed, S; Toliyat, H.A.; Bharadwaj, R; "Selection Criteria of Induction Machines for Speed-sensorless Drive Applications," 0-7803-7116-X/01.

Ferrah, A; Hogben-Laing, P.J.; Bradley, K.J.; Asher, G.M.; Woolfson, J.S.; "The Effect of Rotor Design on Sensorless Speed Estimation Using Rotor Slot Harmonics Identified by Adaptive Digital Filtering Using the Maximum Likelihood Approach," IEEE IAS Annual Meeting, New Orleans, 1997.

Hsu, John; "Monitoring of Defects in Induction Motors Through Air-Gap Torque Observation," IEEE Transactions on Industry Applications, vol. 31, No. 5, Sep./Oct. 1995.

Benbouzid, Mohamed El Hachemi; "A Review of Induction Motors Signature Analysis as a Medium for Faults Detection," IEEE Transactions on Industrial Electronics, vol. 47, No. 5, Oct. 2000.

Thorsen, O.V.; Dalva, M; "Failure Identification and Analysis for High Voltage Induction Motors in Petrochemical Industry," Bergen College, Norway; 0-7803-4943-1/98 1998 IEEE.

Schoen, Randy; Lin, Brian; Habetler, Thomas; Schlag, Jay; Farag, Samir; "An Unsupervised, On-Line System for Induction Motor Fault Detection Using Stator Current Monitoring," IEEE Transactions on Industry Applications, vol. 31, No. 6, Nov./Dec. 1995.

Barbour, A; Thomson, W.T.; "Finite Element Study of Rotor Slot Designs with Respect to Current Monitoring for Detecting Static Airgap Eccentricity in Squirrel-Cage Induction Motors," IEEE Industrial Applications Society Annual meeting, New Orleans, LA Oct. 1997.

Dorrell, D.G.; Thomson, W.T.; Roach, S; "Analysis of Airgap Flux, Current and Vibration Signals as a Function of the Combination of Static and Dynamic Airgap Eccentricity in 3-Phase Induction Motors," The Robert Gordon University, Aberdeen, UK, 0-7803-3008-0/95.

Barbour, A; Thomson, W.T.; "Finite Element Analysis and On-line Current Monitoring to Diagnose Airgap Eccentricity in 3-Phase Induction Motors," The Robert Gordon University, Aberdeen.

"IEEE Guide for Diagnostic Field Testing of Electric Power Apparatus—Electrical Machinery," IEEE Std 62.2 2004; Jun. 2005.

Nandi, Subhasis; Toliyat, Hamid; Parlos, Alexander; "Performance Analysis of a Single Phase Induction Motor Under Eccentric Conditions" IEEE Industry Applications Society Annual Meeting, New Orleans, LA Oct. 1997.

Toliya, H.A.; Arefeen, M.S.; Parlos, A.G.; "A Method for Dynamic Simulation and Detection of Air-Gap Eccentricity in Induction Machines" Texas A & M University Department of Electrical Engineering and Department of Nuclear Engineering; 0-7803-3008-0/95.

Dorrell, D.G.; Thomson, W.T.; Roach, S; "Combined Effects of Static and Dynamic Eccentricity on Airgap Flux Waves and the Application of Current Monitoring to Detect Dynamic Eccentricity in 3-Phase Induction Motors," Electrical Machines and Drives, Conference Publication No. 412, Sep. 1995.

Ho, S.L.; Lau, K.M.; "Detection of Faults in Induction Motors Using Artificial Neural Networks," Electrical Machines and Drives, Conference Publication No. 412, Sep. 1995.

Riley, Caryn; Lin, Brian; Habetler, Thomas; Schoen, Randy; "A Method for Sensorless On-Line Vibration Monitoring of Induction Machines," Georgia Institute of Technology, 0-7803-4067-1/97, 1997 IEEE.

"IEEE Standard Test Procedure for Polyphase Induction Motors and Generators," IEEE Std 112-2004; Nov. 4, 2004.

"Energy Management for Motor Driven Systems" Office of Industrial Technologies, Department of Energy, U.S.A.

"The Repair of Induction Motors, Best Practices to Maintain Energy Efficiency" Association of Electrical and Mechanical Trades.

Shea, John J., "Conditions for Series Arcing Phenomena in PVC Wiring" 0-7803-9113-6/05/$20.00 © 2005 IEEE.

Kang, Dong-Sik, "Experience of Thermal Evaluation & Insulation Diagnosis Techniques for Rotating Machines" KERI Industry Application Research Center, Korea Electrotechnology Research Institute, Jul. 2008.

"Testing of Squirrel Cage Rotors" Reliable Solutions Today, Tech Note No. 23 TN23-1 (updated—Oct. 2003).

Almand, Dave, "Fault Zone Analysis 'Power Circuit'" PdMA Corporation, Department of Technical Support & Training.

Sletbak, Jarle, "Glowing Contact Areas in Loose Copper Wire Connections" IEEE Transactions on Components, Hybrids, and Manufacturing Technology, vol. 15, No. 3, Jun. 1992, 0148-6411/921$03.00 © 1992 IEEE.

"Eliminate Excessive In-Plant Distribution System Voltage Drops" Industrial Technologies Program, Motor Systems Tip Sheet #8—Sep. 2005, U.S. Department of Energy.

"Optimizing Your Motor-Driven System" Fact Sheet, a Program of the U.S. Department of Energy, Motor Challenge.

"Electric Motor Predictive and Preventive Maintenance Guide" Report Summary, Electric Power Research Institute, EPRI NP-7502s.

"Guidelines for Maintaining Motor Efficiency During Rebuilding" Reliable Solutions Today, Tech Note No. 16 (Revised) Originally Published May 1992, revised Sep. 1999.

Christensen, Preben, "Stator Core Testing" Reliable Solutions Today, Tech Note, No. 17 (update—Mar. 1997) TN17-1.

"The Effect of Repair/Rewinding on Motor Efficiency" EASA/ AEMT Rewind Study and Good Practice Guide to Maintain Motor Efficiency.

"Troubleshooting of Electric Motors" EPRI Technical Report NMAC.

Jangho, Yoon and Wiedenbrug, Ernesto "Automated Monitoring of High-Resistance Connections in the Electrical Distribution System of Industrial Facilities" Department of Electrical Engineering, Korea University, Seoul, Korea and Baker Instrument Company, Fort Collins, CO, U.S.A.

Bockstette, Jens, "Upstream Impedance Diagnostic for Three-Phase Induction Motors" 1-4244-1062-2/07/$25.00 © 2007 IEEE.

(56) References Cited

OTHER PUBLICATIONS

Lee, Sang Bin, "Experimental Study of Inter-Laminar Core Fault Detection Techniques Based on Low Flux Core Excitation" 0885-8969/$20.00 © 2006 IEEE Transactions on Energy Conversion vol. 21, No. 1 Mar. 2006.

Kliman, Gerald B, "A New Method for Synchronous Generator Core Quality Evaluation" 0885-8969/04$20.00 © 2004 IEEE Transactions on Energy Conversion, vol. 19 No. 3 Sep. 2004.

"Analysis of the fatigue causes on the rotor bars of squirrel cage asynchronous motors", C. Rojas, M. Melero, M. Cabanas, M. Donision, M. Eteve, J. Vina Olay, A Arguelles Amado, IEEE SDEMPED 2001.

Lee, Sang Bin, "Detection and Classification of Stator Turn Fault and High Resistance Electrical Connections for Induction Machines" Department of Electrical Engineering, Korea University, Seoul, Korea.

Lee, Sang Bin, "On-line Detection of High-Resistance Connections in the Incoming Electrical Circuit for Induction Motors" Department of Electrical Engineering, Korea University, Seoul, Korea.

Kwanghwan Lee, Jongman Hong, Kwangwoon Lee, and Sang Bin Lee, "A Stator Core Quality Assessment Technique for Inverter-fed Induction Machines" Department of Electrical Engineering, Korea University, Seoul, Korea and Baker Instrument Company, Fort Collins, CO, U.S.A.

"Sensorlose Stabbruchdetektierung in Kaefiglaeufermaschinen mittels Neuronaler Netze", J. Blattner, ICMA Mechatronic Systeme Shaker Verlag, Band 3, 1997.

"Motor circuit analysis: Theory, application and energy analysis", H. F. Penrose, 2002, ISBN: 0-9712450-0-2.

"Machinery Vibration Measurement and Analysis", V. Wowk, McGraw Hill, 1997, ISBN-10: 0-07-071936-5.

"Influence of inertia on general effects of faulty rotor bars and the Vienna monitoring method", c. Kral, F. Pirker, G. Pascoli, IEEE SDEMPED 2001.

"Analysis by the Finite Element Method of the influence caused in the current distribution in rotor squirrel-cage IM and current spectrum by the number and distribution of faulty bars during a rotor failure", C. Rojas, M. Melero, M. Cabanas, G. Orcajo, M. Donision, J. Solares, IEEE SDEMPED 2001.

"Assymetry Factors of Induction Motor Rotor Cages", T. Sobczyk, W. Maciolek, IEEE SDEMPED 2001.

"The integration of Machine Fault Detection into an Indirect Field Oriented Induction Machine Drive Control Scheme the Vienna Monitoring Method", R. Wieser, M. Schagginger, C. Kral, F. Pirker, IEEE IAS Annual Meeting 1999.

"Detection of Mechanical Imbalances without Frequency Analysis", C. Kral, T. Habetler, R. Harley, IEEE SDEMPED 2003.

"The use of phase current analysis to detect faults in squirrel cage induction motors onboard military warships", D. Ranking, G. Watt, D. Brown, D. Powell, IEE EMD97.

"Comparative Investigation of Diagnostic Media for Induction Motors: A Case of Rotor Cage Faults", A. Trzynadlowski, E. Ritchie, IEEE Transactions on inductrial electronics, vol. 47, No. 5, 2000.

"The effects of broken rotor bars on the transient run up of induction machines", J. Penman, A. Stavrou, IEE EMD95.

"Broken Bar detection in dincuction machines: Comparison between current spectrum approach and parameter estimation approach", F. Filippetti, G. Francheschini, C. Tassoni, P. Vas, IEEE 0-7803-1993-1/94, 1994.

"Characterisation of Signals by the ridges of their Wavelet Transforms", R. Carmona, W. Hwang, B. Torresani, IEEE Transactions on Signal Processing, vol. 45, No. 10.

"The current analysis program—a software tool for rotor fault detection in three phase induction motors", R. Brunett, J. Watson, IEE EMD95.

"Interbar currents and axial fluxes in healthy and faulty induction motors", H. Meshgin-Kelk, J. Milimonfared, H. Toliyat, IEEE 0-7803-7420-7/02.

"Effects of load on diagnosing broken bar faults in induction motors using the pendulous oscillation of the rotor magnetic field orientation", B. Mirafzal, N. Demerdash, IEEE IAS 2004.

"Broken Rotor-Bar detection in induction machines", S. Stefanko, I. Kurtovic, M. Bogut, M. Kovacevic, M. Momic, IEEE SDEMPED 2001.

"Pattern recognition—a technique for induction machines rotor fault detection 'Broken Bar fault'", M. Haji, H. Toliyat, IEEE IEMDC 2001.

"Broken Bars diagnosis of 3600 rpm 750kW induction motor comparison Modelization and measurement of phase currents", L. Baghli, H. Razik, A. Rezzoug, C. Caironi, L. Durantay, M. Adkim, IEEE SDEMPED 2001.

"Induction machine steady state speed extraction by analysis of stator current signatures", E. Wiedenbrug, A. Wallace, IEEE EMCW 1998.

"A comparison of rotor slot harmonic speed measurement algorithms in the case of not stationary speed signals", M. Aiello, A. Cataliotti, S. Nuccio, IEEE SDEMPED 2001.

"Limitations of model-based methods for electric machine condition monitoring", R. Tallam, T. Habetler, R. Harley, IEEE SDEMPED 2001.

"Hierarchical procedure for the diagnostics of electromechanical system fault", A. Cavallini, F. Filipetti, IEEE SDEMPED 2001.

"Is finding broken rotor bars so easy?", R. Nailen, EASA Apr. 1998.

"Are those new motor maintenance tests really that great?", R. Nailen, EASA 2000.

"Motor current analysis and its application in induction motor fault analysis", M. Xu, T. Alford, Predictive Maintenance Technology National Conference 1997.

"Recent advances in predictive maintenance", C. Nyberg, EASA Convention 2001.

"Sensorless detection of induction motor faults", A. Parlos, K. Kim, R. Bharadwaj, IEEE SDEMPED 2001.

"The use of shaft voltage to detect airgap eccentricity and shorted turns in salient pole alternators", D. Rankin, I. Wilson, IEE EMD95, 1995.

"A review of on-line condition monitoring techniques for three-phase squirrel-gage induction motors—past present and future", W. Thompson.

International Patent Application No. PCT/US08/78875, filed Oct. 4, 2008; Written Opinion of the International Searching Authority dated Dec. 12, 2008.

International Patent Application No. PCT/US08/78875, filed Oct. 4, 2008; International Search Report dated Dec. 12, 2008.

A. V. Jouanne, B. Banerjee, "Assessment of Voltage Unbalance," IEEE Trans. Power Delivery, vol. 16, pp. 782, Oct. 2001.

D. Como, "Threading your way into a solid connection," Plant Services [Online], Available: http://www.plantservices.com/articles/2003/236.html, Feb. 2007.

J. Schlabbach, D. Blume, T.Stephanblome, Voltage Quality in Electrical Power Systems, IEE Power and Energy Series 36, London, 2001, pp. 147-149.

N. Mohan, T. M. Undeland, W. P. Robbins, "Power Electronics," 2nd ed., New York: Wiley, 1995, p. 435.

J. Arrillaga, N. R. Watson, "Power System Harmonics," 2nd ed., New York: Wiley, 2004, p. 196.

D. William, Jr. Stevenson, "Elements of Power System Analysis," 4th ed., New York: McGraw-Hill, 1982, p. 252.

Baker Instrument Company, "Advanced Winding Analyzer IV—Users Manual," 71-015 Rev D., Fort Collins, CO, 2007, p. 62.

"Electric Motor Predictive and Preventive Maintenance Guide," EPRI, San Francisco, CA, Tech. Rep. NP-7502 (2814-35), 1992, p. 3-7.

"The simplified handbook of vibration analysis Volume two", A. Crawford, Computational Systems, Inc. Library of Congress Catalog Card No. 92-72682, 1992.

"Analysis II—Concentrated vibration signature analysis and related condition monitoring techniques", Technical Associates of Charlotte, P.C., Feb. 10-13, 1998.

"Troubleshooting of Electric Motors," EPRI, San Francisco, CA, Final Rep. 1000968, Dec. 2000, p. 6-4.

FLIR Homepage, [Online], Available: http://www.flir.de/success/ir_image/1207/industry_id/1001/, Feb. 2007.

(56) References Cited

OTHER PUBLICATIONS

Motors and Generators, NEMA Standards Publication MG 1, 20.24.5, 2006.
Energy Management Guide for Selection and Use of Polyphase Motors, NEMA Standards Publication MG 10, Table 2-1, 1994.
J. Bockstette, E, Stolz, E. Wiedenbrug, "Upstream Impedance Diagnostic for Three-Phase Induction Motors" 2007.
"Guidelines for Maintaining Motor Efficiency During Rebuilding" Reliable Solutions Today, Tech Note No. 16 May 1992.
J. Yoon, J. Yun, S.B. Lee, E.J. Wiedenbrug, "Automated Monitoring of High-Resistance Connections in the Electrical Distribution System of INdustrial Facilities," Proceedings of IEEE IAS (Industrial Applications Society) Annual Meeting, Edmonton, Alberta, Oct. 5, 2008.
D. Almand, "Fault zone analysis—power circuit," Proc. of the PDMA Motor Reliability Technical Conference, 2004. , [Online] Available: http://www.pdma.com/oldart.html.
R. Newport, "The loose electrical connection myth," Maintenance Technology, Feb. 1998. [Online] Available: http://www.mt-online.com/articles.
G.A. McCoy, and J.G. Douglass, Energy management for motor driven systems, Office of Industrial Technologies, U.S. Department of Energy, 2000. [Online] Available: http://www1.eere.energy.gov/industry/best practices/techpubs_motors.html.
Washington State Energy Office, Keeping the spark in your electrical system, Oct. 1995.
Bonneville Power Administration, Electrical distribution system tune-up, Jan. 1995.
G. C. Stone, E.A. Boulter, I. Culbert, and H. Dhirani, Electrical Insulation for Rotating Electrical Machines, IEEE Press, Piscataway, NJ, 2004.
J.J. Shea, "Conditions for series arcing phenomena in PVC wiring," Proc. of the IEEE Holm Conference on Electrical Contacts, pp. 167-175, Sep. 2005.
J. Sletbak, R. Kristensen, H. Sundklakk, G. Navik, and M. Runde, "Glowing contact areas in loose copper wire connections," IEEE Transactions on Components, Hybrids, and Maufacturing Technology, vol. 15, No. 3, pp. 322-327, Jun. 1992.
R.S. Colby, "Detection of high-resistance motor connections using symmetrical component analysis and neural networks," Proc. of IEEE SDEMPED, pp. 2-6, Atlanta, GA, 2003.
J. Yun, J. Cho, S.B. Lee, and J. Yoo, "On-line Detection of High-Resistance Connections in the Incoming Electrical Circuit for Induction Machines," Proc. of IEEE-IEMDC, vol. 1, pp. 583-589, Antalya, Turkey, 2007.
J.J. Grainger, and W.D. Stevenson, Power System Analysis, McGraw-Hill, New York, 1994.
G. B. Kliman, W. J. Premerlani, R. A. Koegl, and D. Hoeweler, "A new approach to on-line turn fault detection in AC motors," Proc. IEEE-IAS Annual Meeting, vol. 1, pp. 687-693, 1996.
Lee, Sang Bin; Kliman, Gerald B; Shah, Manoj r; Nair, N Kutty; Lusted, R. Mark; "An Iron Core Probe Based Inter-Laminar Core Fault Detection Technique for Generator Stator Cores," IEEE Transactions on Energy Conversion, vol. 20, No. 2, Jun. 2005.
Lee, Sang Bin; Kliman, Gerald B; Shah, Manoj R; Mall, W. Tony; Nair, N. Kutty; Lusted, R. Mark; "An Advanced Technique for Detecting Inter-Laminar Stator Core Faults in Large Electric Machines," IEEE Transactions on Industry Applications, vol. 41, No. 5, Sep./Oct. 2005.
Kral, C; Pirker, F; Pascoli, G; "Model Based Detection of Rotor Faults without Rotor Position Sensor—the Sensorless Vienna Monitoring Method," Symposium on Diagnostics for Electric Machines, Power Electronics and Drives, Atlanta, GA pp. 24-26, Aug. 2003.
Schoen, Randy R; Lin, Brian K; Habetler, Thomas G; Schlag, Jay H; Farag, Samir; "An Unsupervised, On-line System for Induction Motor Fault Detection Using Stator Current Monitoring," IEEE Transactions on Industry Applications, vol. 31, No. 6, Nov./Dec. 1995.
Cabanas, M.F.; Gonzalez, J.L. Ruis; Sampayo, J.L.B.; Melero, M.G.; Rojas, C.H.; Pedrayes, F; Arguelles, A; Vina, J., "Analysis of fatigue causes on rotor bars of squirrel cage asynchronous motors: experimental analysis and modeling of medium voltage motors," SDEMPED 2003, Atlanta, GA, Aug. 2003.
Schoen, Randy R; Habetler, Thomas G., "Evaluation and Implementation of a System to Eliminate Arbitrary Load Effects in Current-Based Monitoring of Induction Machines," IEEE Transactions on Industry Applications, vol. 33, No. 6, Nov./Dec. 1997.
Kostic-Perovic, Dragica; Arkan, Muslum; Unsworth, Peter; "Induction Motor Fault Detection by Space Vector Angular Fluctuation," School of Engineering, University of Sussex, 2000 IEEE.
Kang, Dong-Sik; Korea Electrotechnology Research Institute Presentation; "Introduction of KERI".
McCully, P.J.; Landy, C.F.; "Evaluation of Current and Vibration Signals for Squirrel Cage Inductor Motor Condition Monitoring," University of Witwatersrand, South Africa, Conference publication No. 444; Sep. 2007.
Delpray, Nathalie; Escudie, Bernard; Guillemain, Philippe; Kronland-Martinet, Richard; Tchamitchian, Philippe; Torresani, Bruno; "Asymptotic Wavelet and Gabor Analysis: Extraction of Instantaneous Frequencies," IEEE Transactions on Information Theory, vol. 38, No. 2, Mar. 1992.
Yazici, Birsen; Kliman, Gerand; Premerlani, William; Koegl, Rudolph; Abdel-Malek, Aiman; An Adaptive, On-line Statistical Method for Detection of Broken Bars in Motors Using Stator Current and Torque Estimation; IEEE Industrial Applications Society Annual Meeting, New Orleans, Oct. 5-9, 1997.
Carmona, Rene; Hwang, Wen; Torresani, Brun; "Characterization of Signals by the Ridges of their Wavelet Transforms," IEEE Transactions on Signal Processing, vol. 45, No. 10, Oct. 1997.
Manolas, St.J; Tegopoulos, J.A.; "Analysis of Squirrel Cage Induction Motors with Broken Bars and Rings," IEEE Transactions on Energy Conversion, vol. 14, No. 4, Dec. 1999.
Williamson, Stephen; Healey, Russell; Lloyd, Jerry; "Rotor Cage Anomalies and Unbalanced Magnetic Pull in Single-Phase Induction Motors, Part I. Analysis" and "Rotor Cage Anomalies and Unbalanced Magnetic Pull in Single-Phase Induction Motors, Part II, Experimental and Theoretical Studies." Cambridge University Engineering Department, and Advanced Motor Development Center, Emerson Electric Company.
Koch, Brian; Spee, Rene; "A Comparison of Stack Preparation Methods for Bar Insulation in Diecast Rotors," IEEE Industry Applications Society Annual Meeting, New Orleans, LA, Oct. 5-9, 1997.
Williamson, Stephen; Boger, Michael; "Impact of Inter-Bar Currents on the Performance of the Brushless Doubly-Fed Motor," IEEE Industry Applications Society Annual Meeting, New Orleans, LA, Oct. 1997.
Fiser, R; Ferkolj, S; Soline, H; "Steady State Analysis of Induction Motor with Broken Rotor Bars," Laboratory for Electromotors Drives, Slovenia; Electrical Machines and Drives, Conference Publication No. 412, Sep. 11-13, 1995.
Zhang, Zhengping; Ren, Zhen; Huang, Wenying; "A Novel Detection Method of Motor Broken Rotor Bars Based on Wavelet Ridge." Guangdong Power and Test Research Institute, The Electric Power College, South China University of Technology.
Henao, H; Capolino, G.A.; Razik, H., "Analytical Approach of the Stator Current Frequency Harmonics Computation for Detection of Induction Machine Rotor Faults," SDEMPED 2003, Atlanta, GA, Aug. 2003.
Meshgin-Kelk, H.; Milimonfared, J; Toliyat, H.A.; "Interbar Currents and Axial Fluxes in Healthy and Faulty Induction," IEEE 2002, 0-7803-7420-7/02., Department of Electrical Engineering, Amir-Kabir University of Technology and Texas A & M University.
U.S. Appl. No. 12/205,816, filed Sep. 5, 2008, Nonfinal Office Action dated Oct. 9, 2012.
U.S. Appl. No. 12/205,816, filed Sep. 5, 2008, Ex Parte Quayle Office Action dated Sep. 13, 2013.

* cited by examiner

PORTABLE SYSTEM FOR IMMOTIVE MULTIPHASIC MOTIVE FORCE ELECTRICAL MACHINE TESTING

This application is the United States National Stage of International Application Number PCT/US2008/078875, filed 4 Oct. 2008, published as WO 2010/039153 A1 on 8 Apr. 2010, said PCT application hereby incorporated herein by reference in its entirety.

TECHNICAL FIELD

The present invention relates to methods and devices to test electric machine circuitry. Specifically it relates to systems providing a portable device to test for various faults in a multiphasic motive force electrical machine, such as moves or rotates through the application of multiple phases of power in normal operation. Separately, the invention also relates to designs for unique rotor conductivity anomaly testers, magnetic core anomaly testers, and rotational eccentricity fault testers.

BACKGROUND

Electric machines, such as electric motors or the like play a critical role in our society. They often provide operations which many times cannot be interrupted. Continued, uninterrupted operation is often critical to the devices for which they are a component. Oftentimes, they cannot be permitted to fail. Unfortunately, their operation can at times be attended by internal faults and weakened components. These weaknesses can exist in a stator, in a rotor or other moving component, or in the configuration of a rotating device.

Considering the stator of an induction machine as one example, it can be understood that the stator core of an induction machine is often built from thin insulated, silicon-steel (Si—Fe) laminations to minimize the hysteresis and eddy current losses for high efficiency operation. The individual lamination sheets are usually deburred and coated with insulation material to prevent conduction between the sheets to reduce the risk of inter-laminar eddy currents. The laminations are usually held tightly together and shorted to the frame for structural rigidity (prevention of vibration) and safety. The laminations may be welded together for small machines, and may be interlocked with the axial frame bars and clamped, for larger machines.

The stator core loss can account for roughly 20% of induction machine losses at rated load. It can increase due to any type of defect in the stator core caused by excessive thermal, electrical, mechanical, or environmental stresses. Since the interlaminar insulation material is subject to deterioration and damage, shorts between laminations can be introduced due to a number of reasons listed including:

Stator-rotor contact due to machine mechanical defects,
Core overheating during rewind (burnout oven), or due to ground current flow or cooling defects,
Defects, damage, or foreign materials introduced during manufacturing, inspection, or repair, and
Abrasion due to vibration (core looseness or machine vibration).

If the laminations are shorted for any reason such as those listed above, a circulating interlaminar eddy current larger than that compared to normal operation can be induced in the core. The increase in eddy current can result in additional losses and can decrease the efficiency of the machine. Localized heating due to the fault current can also damage the stator winding insulation leading to ground failure. For large machines, the core fault can gradually progress in severity and can even result in melting of the stator core. In addition to the increase in eddy current losses, thermal stress or mechanical stress on the laminations due to compressive stress/physical abuse can increase the hysteresis losses. Exposure to excessive thermal or mechanical stresses can alter the magnetic properties of the lamination (decrease in permeability), and can result in an increase in hysteresis losses.

When motors are operated with pulse width modulated (PWM) inverters, the stator core and inter laminar insulation can be exposed to higher thermal and electrical stresses. The high frequency voltage and current harmonic components due to PWM switching operation can cause higher capacitive leakage and can cause circulating eddy currents to flow in the stator core, which may result in additional heating. The cooling efficiency of the motor can also be reduced under low speed operation since the cooling fan speed can be reduced. This can result in operation at a higher temperature when the motor is driven with an inverter. The electrical (high dv/dt) and thermal (increased temperature) stresses can accelerate the degradation of the stator interlaminar insulation and core, and can increase the chances of failure. Although the above relates primarily to stator failures, it can be extended to rotor and other failures.

It can be seen from the discussion above that any type of defect in the stator core can increase the core losses (decrease in efficiency) and can increase the chances of machine failure (decrease in reliability). Since increase in core loss can be a symptom of stator core degradation leading to failure, it is important to monitor the core quality (losses) for reliable and efficient motor operation. It can also be seen that stator core condition monitoring is even more important for inverter-fed machines, since they are exposed to increased thermal and electrical stresses.

Unfortunately the available means of detecting core problems when the machine is in service has been to use chemical monitoring such as core monitors or tagging compounds to detect hot spots in the stator core. Although chemical monitoring is effective for detecting core problems on-line, it is only considered cost-effective for very large machines.

The most effective tests for detecting local damage in the stator core due to inter laminar insulation failure are the core ring test (loop test) and the low energy core tests. In the core ring test, an external winding is formed around the yoke of the stator core after rotor removal to excite the yoke of the stator core at 80~100% of rated flux. After core excitation, an infrared IR thermal imaging camera is usually used to detect hot spots in the stator bore due to interlaminar fault currents. Low energy core tests can use the same excitation configuration, but may allow testing at 3~4% rated flux level. In these tests, a flux sensing probe is scanned in the axial direction along the inner surface of the core to detect irregular flux patterns caused by inter laminar fault current. Although these tests are effective for detecting and locating local core problems, they require rotor removal and specialized test equipment. These tests are usually applied to generators or large motors rated above tens of megawatts. Tests may also use a probe such as described in a patent of one of the current inventors, U.S. Pat. No. 6,847,224, hereby incorporated by reference.

For motors rated up to several megawatts, which often fall in the range of inverter-fed induction machines, the core loss test is the most commonly used test for stator core quality assessment. The stator core loss test setup is often identical to the core ring test above, where the yoke of the stator core is excited at near rated flux (often ≈1.32 T). The power input (stator core loss) may be measured to monitor problems in the stator core and its insulation that result in an increase in core losses. This test can provide a good indication of the overall stator core condition, but it usually requires motor disassembly and rotor removal for testing.

The core loss can also be measured without motor disassembly if the loss segregation test procedure in IEEE STD. 112B is used. In this test method, the no load loss, which consists of the stator I²R loss, $P_s$, stator core loss, $P_{c,s}$ and friction & windage loss, $P_{f\&w}$, is measured at a number of input voltages, often up to about 125% rated voltage. If the no load loss minus $P_s$ is plotted as a function of the voltage squared at a number of voltage levels and the curve is extrapolated to zero voltage, the intercept of the curve at zero voltage represents $P_{f\&w}$. The stator core loss, $P_{s,c}$, can be obtained by subtracting $P_s$ and $P_{f\&w}$ from the no load loss measurement. This test is also effective for monitoring the overall (average) condition of the core, but, it requires the motor to be operated at no load with a variable sinusoidal voltage source.

From the existing techniques, it can be seen that there are limitations to applying the currently available on-line and off-line core test methods to inverter-fed machines. On-line chemical monitoring cannot be justified for use in inverter-fed machines due to the cost involved in implementation. The off-line core ring test or low energy core tests could be used, but are not considered cost-effective for the machines rated below several megawatts. The core loss test is relatively simple and effective for monitoring core problems, but it usually can only be performed during a major outage since it requires machine disassembly and rotor removal. The no load loss segregation method does not require motor disassembly, but usually requires the motor to be run with the load removed at a number of voltage levels. It can be seen that all the core test methods are off-line tests that do not allow frequent monitoring of the core, and usually require motor disassembly or operation at no load. In addition, the tests suitable for inverter-fed machines can require specialized equipment for testing and may be only capable of testing the overall (or average) condition of the core.

Another type of fault is that of a rotor conductivity fault. Broken rotor bars (as one type of rotor conductivity fault), can account for 5~10% of induction machine failures. These can be caused by gradual deterioration due to a combination of thermal, mechanical, electromagnetic, dynamic, environmental operating stresses or design/manufacturing defects. Often a crack is usually initiated between the bar and end ring connection. If a bar beaks, the rotor becomes electromagnetically asymmetric due to the absence of current in the broken bar.

There are both off-line and on-line methods available for detecting broken bars and some methods available include the single phase rotation test, growler test, magnetic imaging test, fluorescent dye penetration test, rated flux test, and the hot spot methods. The single phase rotation test is the only off-line method which does not require motor disassembly. In this test, though, two phases of the motor are excited with a single phase supply to produce a fluctuating field. The rotor is gradually rotated and the variation of the stator current is observed to detect the presence of rotor bars. This test is inconvenient because it requires proximity to the motor and the rotor shaft to be rotated, which could be very difficult depending on the motor and its operating environment.

The on-line methods analyze the spectrum of the speed, vibration, torque, flux, or current measurement to observe a particular speed dependent roto bar characteristic frequency to detect asymmetry in the flux pattern due to asymmetric rotor current. On-line methods are convenient since bars can be monitored when the motor is energized. However, the cost is high because dedicated monitoring equipment must be installed for each motor. Since it relies on the speed dependent frequency, a speed measurement or estimate is required and it is difficult to use in applications where the speed varies rapidly due to variable load or speed command. Broken bar signatures can also be confused with load problems, and it is difficult to detect this frequency for low slip (light load/high efficiency) applications. Therefore, it is desirable to have a new method that can detect broken bars off-line remotely without disassembling the machine. Thus, it is desirable to test both stator core and rotor components more frequently without motor disassembly, motor operation, or specialized equipment. It is also desired to have improved sensitivity to detect local core and other problems. Given the importance of stator core, rotor, or other monitoring for inverter-fed machines, and the limitations of applying the existing techniques, it is a goal of the present invention to provide new testing approaches suitable for inverter-fed machines and that may provide a sensitive stator core and rotor quality assessment technique that can be implemented for frequent monitoring without motor disassembly/operation, or additional hardware. Unfortunately none of the above techniques fulfill these criteria.

DISCLOSURE OF THE INVENTION

The present invention provides a portable test device to monitor identify faults in a stator, rotor, or in eccentricity of a multiphasic motive force electrical machine without removal of components, in situ, and in a way that is more convenient than most existing techniques. It provides a fundamentally new technique that overcomes many of the problems of existing methods. In a variety of embodiments the present invention presents a new understanding through which different types of faults can be detected.

Accordingly, it is an objective of embodiments of the present invention to provide techniques that overcome the limitations of the most existing test methods. An objective is to provide a system that can be implemented in situ for an existing multiphasic motive force electrical machine.

Naturally, other objectives are presented throughout the specification and claims, and the above list is not to be construed as limiting.

MODE(S) FOR CARRYING OUT THE INVENTION

The present invention includes a variety of aspects, which may be combined in different ways. The following descriptions are provided to list actions and elements and to describe some of the embodiments of the present invention. These elements are listed with initial embodiments, however it should be understood that they may be combined in any manner and in any number to create additional embodiments. The variously described examples and preferred embodiments should not be construed to limit the present invention to only the explicitly described systems, techniques, and applications. Further, this description should be understood to support and encompass descriptions and claims of all the various embodiments, systems, techniques, methods, devices, and applications with any number of the disclosed elements, with each element alone, and also with any and all various permutations and combinations of all elements in this or any subsequent application.

Figure 1:
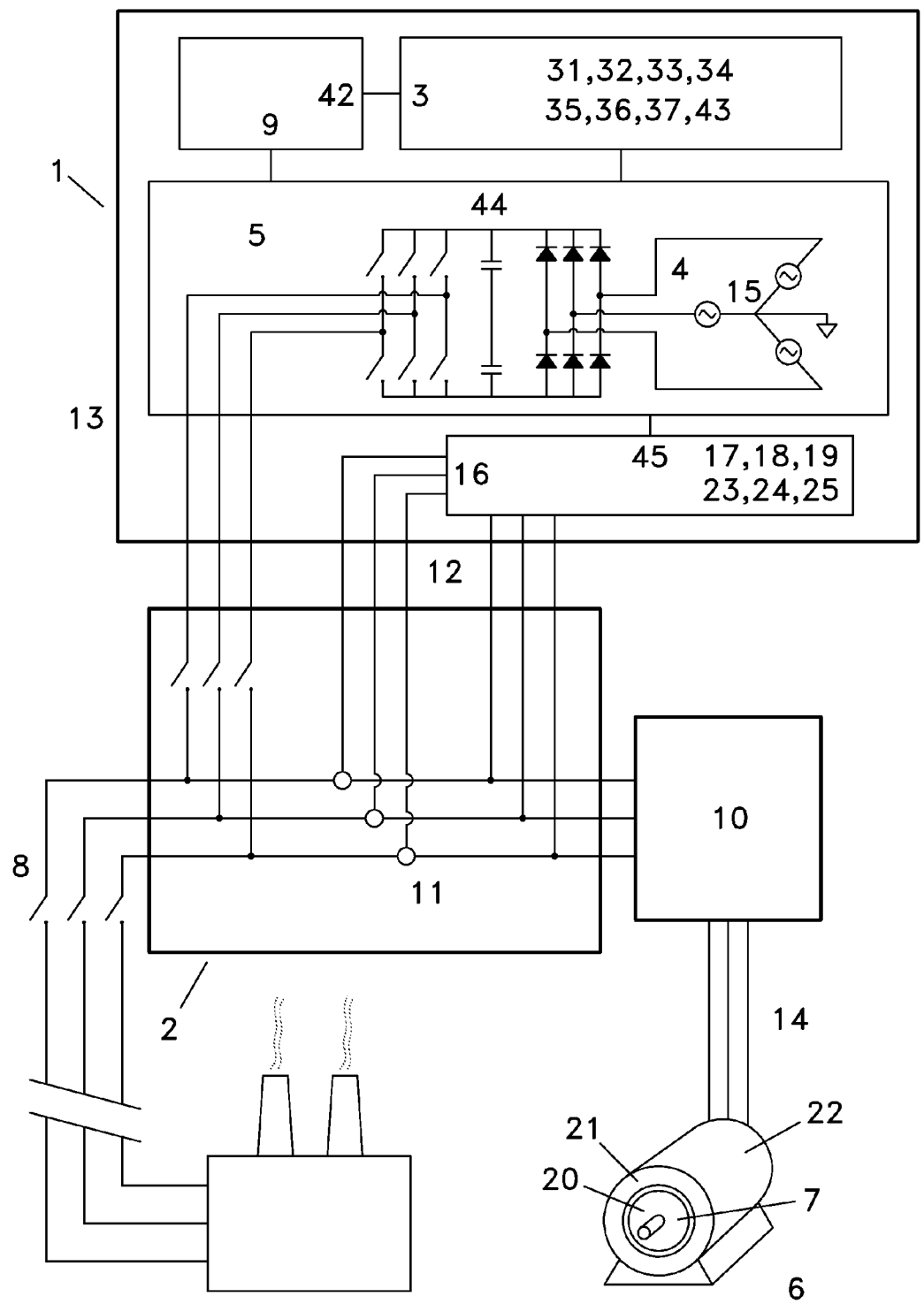
FIG. 1 is a block diagram of a multiphasic motive force electrical machine test device according to one embodiment of the present invention.

In order to understand the techniques of the present invention, it is helpful to understand both a basic machine or motor circuitry system. FIG. 1 illustrates a basic design according to an embodiment of the present invention. The test device (1) may connect to a machine or motor circuitry system including a multiphasic motive force electrical machine (6) that may be powered by an electrical supply (14) perhaps leading all the way back to a power plant. From this diagram, it be understood that the electrical supply (14) can be very expansive. The power plant or other effective source may be located miles and even hundreds of miles from the actual machine or motor itself, although testing is preferred to be accomplished proximate to the multiphasic motive force electrical machine (6) itself for practical and economic reasons. As may be understood from FIG. 1, the multiphasic motive force electrical machine (6) may be controlled by a motor control center (10). Since the multiphasic motive force electrical machine (6) is designed to provide a motive force, it will typically have some type of movement element (7). Naturally the multiphasic motive force electrical machine (6) can be a rotating electrical motor. As an electrical motor, the multiphasic motive force electrical machine (6) can have a rotor (20), a stator (22), and a magnetic core (21).

At any point along the electrical supply (14), a test device (1) can have an insert. This insert can be a detachable electrical power connectivity (2), so that one can detachably electrically connect the test device (1). The test device (1) can be designed to issue an immotive test signal for a multiphasic motive force electrical machine. This specific type of test signal can be designed for different purposes in order to detect different faults. In this fashion, the test device (1) can be configured as a conductivity anomaly tester, a magnetic core anomaly tester, or a rotational eccentricity fault tester.

One aspect that can be important to understand is that the test device (1) can be portable. The test device can be contained with a housing or even a vehicle or trailer that can serve as a portable test device containment (13). The portability can be important because it can facilitate the step of accepting, a multiphasic motive force electrical machine in situ in its regular working environment. Disassembly and perhaps relocation to a laboratory facility or the like is unnecessary. Thus, by positioning a portable test device proximate to an electrical supply for the multiphasic motive force electrical machine (6), the test device (1) can be used at differing locations and on differing machines. The detachable electrical power connectivity (2) can issue from the test device (1) so it can be easily plugged it into the electrical supply (14) at any selected location. This detachable electrical power connectivity (2) can contain sensor elements (11) and other componentry to facilitate the test operations. The connection location of the detachable electrical power connectivity (2) can be before or after or even into the motor control center (10). Thus, the connectivity (2) can serve as a multiphasic motive force electrical machine in situ connectivity, and can serve to apply the immotive test signal to a rotor, a stator, or otherwise in situ. When appropriately configured, the test device (1) can be moved from site to site and can provide a signal that can be applied to a stator in situ or to a rotor in situ without any disassembly or interruption of machine operation.

As mentioned, the detachable electrical power connectivity (2) can issue from the test device (1). Test device (1) can contain signal generators such as multiphasic motive force electrical machine signal generators (4) that can establish an immotive multiphasic test signal. Multiphasic test signal can be supplied to the multiphasic motive force electrical machine (6). Test containment supply circuitry (5) can issue from the signal generators (4) and can supply the signal through the detachable electrical power connectivity (2) to the electrical supply (14). These multiphasic motive force electrical machine signal generators (4) can be controlled to conduct specific operations. This can be accomplished by an immotive multiphasic test signal controller (3). Similarly, within the test device (1) there can be included analyzer capability to read the signal sensed by the sensor elements (11), and make appropriate determinations. Through appropriate design or configuration, the analyzer can serve as a multiphasic motive force electrical machine fault analyzer (16).

As mentioned above, the multiphasic motive force electrical machine signal generators (4) can be established within the test device containment (13) so that the test signal can be applied to at least a portion of the electrical supply (14). Naturally as may be understood, the signals can be generated by some type of inverter. The test device (1) may include harder may be a multiple phase test signal inverter (44) that actually generates the signals. Thus, any type of a multiple signal output for a multiphasic machine can be considered as a providing multiphasic motive force electrical machine signal generators (4).

An important aspect of embodiments of the invention is that the signal that is output is actually an immotive multiphasic test signal. This immotive multiphasic test signal is an electrical output that in spite of it being connected to the phases of a multiphase machine does not cause significant motion in the motive force electrical machine. This is accomplished by providing multiphasic signals whose relative amplitudes are selected so that the phase combination merely causes a pulse and not a rotational or other movement event. The significance of this type of a test signal can be understood in context of the energy losses in induction machines.

Figure 2:
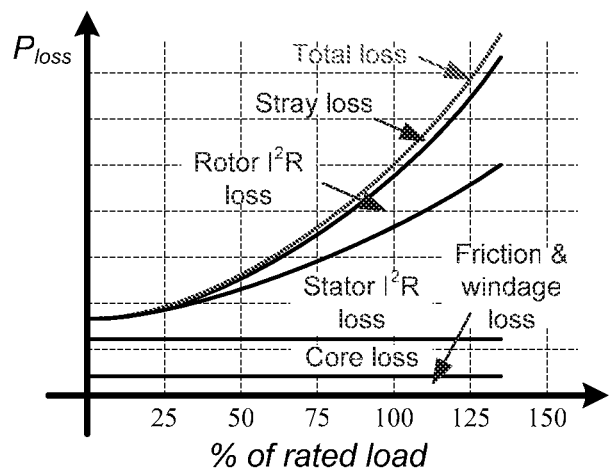
FIG. 2 is a plot showing relative losses as a percent of load that can exist for a typical breakdown of a multiphasic motive force induction powered device such as a rotating electrical motor.

The typical breakdown in a multiphasic motive force electrical machine (6) can often be characterized as five types of induction machine losses: the stator and rotor $I^2R$ loss, $P_s$ and $P_r$, core loss, $P_c$, friction and windage losses, $P_{f\&w}$, and stray loss, $P_{stray}$, are shown in FIG. 2 as a function of % rated load. It can be seen in the figures that $P_{core}$ and $P_{f\&w}$ are insensitive to load variation, whereas the $I^2R$ and stray losses increase significantly with load for fixed frequency operation. The losses in the stator and rotor conductors, $P_s$ and $P_r$, can be expressed as shown in, $$P_s = 3I_s^2 R_s, \quad (eq1)$$

$$P_r = 3I_r^2 R_r, \quad (eq2)$$

where $R_s$ and $R_r$ represent the stator and rotor resistance, and $I_s$ and $I_r$ represent the stator and rotor current, respectively. It can be seen in (eq1)-(eq2) that the conductor losses increase proportionally with the square of the current. The losses in the stator and rotor core, $P_{c,s}$ and $P_{c,r}$, consist of hysteresis and eddy current losses, $P_h$ and $P_e$. They can be expressed analytically as shown in (eq3)-(eq4), respectively, as a function of the peak flux density, $B_{peak}$, and excitation frequency, f.

$$P_h = k_h B_{peak}^m f \quad (eq3)$$

$$P_e = k_e B_{peak}^2 f^2 \quad (eq4)$$

Constants $k_h$ and $k_e$ depend on the geometrical dimensions and physical properties of the lamination material, and superscript m in (eq3) is a constant between 1.5 and 2.5 that depends on the lamination material. It can be seen in (eq3)-(eq4) that both $P_h$ and $P_e$ increase with the flux density and excitation frequency, and most of the core losses are in the stator ($P_{c,s} \gg P_{c,r}$) under motor operation since the excitation frequency in the rotor is very low compared to that of the stator. The friction and windage losses occur due to the friction in the bearings and wind resistance between the rotating components (cooling fan, rotor stirrer, etc) and air, and can be approximated as $$P_{f\&w} = k_f \omega_m^2 + k_w \omega_m^3, \quad (eq5)$$

where $k_f$ and $k_w$ are constants and $\omega_m$ is the motor speed. It can be seen in (eq5) that the friction and windage losses increase with motor speed. The stray loss represents the portion of the total loss in the machine that is not accounted for in the $P_s$, $P_r$, $P_c$, $P_{f\&w}$, losses described above.

When performing the core loss test, the measured input power includes only the stator core loss, if the excitation winding loss is compensated for in the loss measurement. In the loss segregation test under no load, $P_s$ and $P_{f\&w}$ must be separated from the input power measurement to obtain the stator core loss, as can be seen in FIG. 2.

Figure 3:
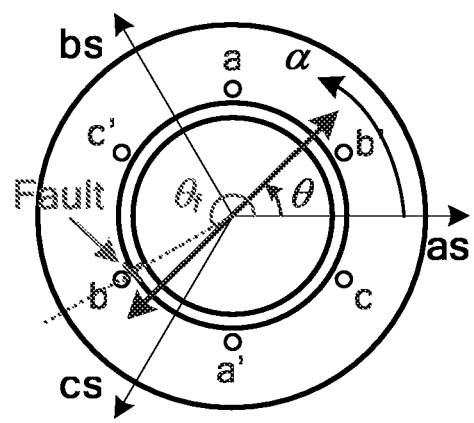
FIG. 3 is a cross sectional depiction of a rotating multiphasic motive force electrical machine depicting the flux vector location as θ and a magnetic core fault location as $\theta_f$.

The main concept of using the test device (1) as a magnetic core anomaly tester, a rotor conductivity anomaly tester, or a rotational eccentricity fault tester involves using the inverter to test the stator core, the rotor, or the overall eccentricity characteristics whenever the motor is not in use, namely, by applying a immotive multiphasic test signal. The inverter is operated to excite the machine using the stator winding or rotor elements with a pulsating AC magnetic field at a set of fixed locations, as shown in FIG. 3, by making the machine be stationary or when the machine is at standstill or stationary. The change in the input power can be measured to monitor the increase a fault such as in the core loss due to core problems, and as in the core loss or loss segregation test. Since the stator core or rotor quality can be tested whenever the motor is stopped, it can provide frequent testing compared to existing off-line tests performed during a major outage (typically once every 3-6 years). This can be significant when it is understood that faults can propagate rapidly once they arise. It can be applied to improve the reliability and efficiency of the multiphasic motive force electrical machine (6) since an increase in the losses due to core or stator or rotor problems can be detected at an early stage before such progress to a failure. This is a significant improvement in the maintenance strategy compared to existing test methods since the core or stator or rotor can be tested frequently without motor disassembly or motor operation. Frequent testing also results in savings in the maintenance cost since prioritization and scheduling of machine maintenance can be performed in a more efficient manner, and specialized test equipment is not required (core tester can even be built-in to the inverter). Embodiments can also be configured to be capable of detecting local core problems with high sensitivity. By using a fixed angular condition immotive multiphasic test signal waveform signal generator as one or more of the multiphasic motive force electrical machine signal generators (4) in the test device (1), the test device (1) can generate a fixed angular condition immotive multiphasic test signal that does not cause a force about an axis or along a line as in a linear actuator. The signal itself can prevent movement and can be an immotive multiphasic test signal by simply selecting the amplitudes for a typical multiphasic signal.

To apply an immotive multiphasic test signal, test device (1) can include an immotive multiphasic test signal controller (3). This multiphasic test signal controller (3) can cause an immotive signal to go through the test containment supply circuitry (5) and onto the multiphasic motive force electrical machine (6). A variety of controller configurations can achieve a variety of test functionalities. Voltage, current, or other variations can be made through the multiphasic test signal controller (3). For instance, controller can serve as an immotive multiphasic test signal voltage variation controller, an immotive multiphasic test signal current variation controller, or an immotive multiphasic test signal magnitude variation controller. With respect to varying a magnitude of the signal, it can be understood that the controller can achieve its immotive functionality by making sure that each of the multiphasic signals have proper amplitudes so that the combination of each of them yields no rotation or other movement result. Relative amplitudes between the multiple signals (three are shown in the figure for illustrative purposes only; there may be any number, of course) can be varied proportionally so that no motion occurs or they can be varied differentially so that some limited amount of motion can occur, or such as when incrementing the device or magnetization plane to a different test location. Thus, in some embodiments, the controller can also serve as an immotive multiphasic test signal relative amplitude variation controller (37). Frequency variations can also be made and so the controller can serve as an immotive multiphasic test signal frequency variation controller.

By varying the test signal, additional information can be discerned. The test device (1) can include, or the controller can be configured as an immotive multiphasic test signal variation controller (31) that can vary the immotive multiphasic test signal. This variation can be of voltage, magnitude, relative magnitude, frequency, or other attributes of the test signal. As discussed below, in some embodiments, a frequency variation can yield significant information from which fault determinations can be made.

As mentioned above, the test signal needs to be an immotive test signal, namely, one that does not cause substantial motion. In keeping with this desire, the test device (1) can have a requirement that can help to assure that movement elements (7) are established in a substantially stationary state. This requirement can be met by an operator or can be automated, such as by having multiphasic machine operation shutdown switches (8) controlled by a capability within the test device (1). It should be understood that the multiphasic machine operation shutdown switches (8) are shown apart from the detachable electrical power connectivity (2) only to anticipate operational standards whereby power would normally be disconnected in order to connect a portable device's connector. Thus, it can be understood that the rotor or other movement element (7) can be de-energized by a separate operation or perhaps by operating multiphasic machine operation shutdown switches (8) through a test device capability, perhaps such as a separate deenergization controller or even by having the immotive multiphasic test signal controller (3) serve as a deenergization controller. All that may be necessary is to or shut off power to the multiphasic motive force electrical machine (6). By establishing a substantially stationary state, the rotor or other movement element (7) can either be fully stopped or its movement can be small relative to the test event so that individual features can be discerned. This could exist, for example by superimposing a perhaps sub-hertz frequency movement signal and a significantly higher frequency of application of a test signal to discern the desired results. The deenergization requirement can be a test protocol or prior connection standard or it could be an operative command, of course.

As can be seen from FIG. 1, waveform signal generators can be interconnected. The interconnection (15) can be at the signal generators themselves, or it may exist within the multiphasic motive force electrical machine (6), in circuitry, or the like. This interconnection can assure proper voltage operation to cause a truly immotive signal to be applied.

As mentioned above, the test signal can be varied and reapplied to the multiphasic motive force electrical machine (6). By applying different signals, different information can be gleaned and it can be a comparison between the information that yields the proper analysis. For such embodiments, the test device (1) can include an immotive multiphasic test signal reapplication controller (32). Reapplication controller (32) can act to regenerate an immotive multiphasic test signal. This regenerated test signal can be a test signal that has been varied in some fashion from the prior applied test signal. The test device (1) can operate to utilize the same type of response to the regenerated immotive multiphasic test signal. In this fashion, the test device (1) can multiply sense a plurality of responses. These differing responses can be compared by some type of analysis capability, perhaps by having the multiphasic motive force electrical machine fault analyzer (16) configured as a comparative test signal response analyzer. In instances where the test signal is known, this can be compared with an output to yield the desired information. Thus, the multiphasic motive force electrical machine fault analyzer (16) can serve as an input-output comparative test signal response analyzer.

Analysis can be conducted in many manners. Power, voltage, current, and other variations can be sensed and analyzed and perhaps compared, thus the multiphasic motive force electrical machine fault analyzer (16) can function as a power variation comparative test signal response analyzer, or a voltage variation comparative test signal response analyzer, a current variation comparative test signal response analyzer. Similarly, it can achieve analyzing a power effect variation, analyzing a voltage effect variation, analyzing a current effect variation, or the like. The analyzer can serve as a frequency effect comparative test signal response analyzer, an angular effect comparative test signal response analyzer, a rotor angle effect comparative test signal response analyzer, a stator magnetization plane effect comparative test signal response analyzer, and the like.

As may be appreciated from the above, a variety of test signals can be applied. The signal generator capability can be a sinusoidal waveform immotive multiphasic test signal generator, an about ¼ Hz immotive multiphasic test waveform signal generator, an about 10 Hz immotive multiphasic test waveform signal generator, an about 500 Hz immotive multiphasic test waveform signal generator, an about 1000 Hz immotive multiphasic test waveform signal generator, a subhertz immotive multiphasic test waveform signal generator, and even a high and low frequency immotive multiphasic test waveform signal generator. In this latter embodiment, both a higher frequency, namely one that reveals effects such as a core fault more readily as well as a low frequency, namely one that reveals effects such as a rotobar fault or even a deeper rotobar fault more readily can be applied.

Naturally frequencies can be superimposed or applied separately. A multiple frequency immotive multiphasic test signal generator (34) can be included so that more than one frequency is applied to the machine at some point or points in time. Multiple frequencies can even be achieved by a frequency sweep immotive multiphasic test signal generator. Superimposed frequencies can exist as a saw tooth or other known waveform immotive multiphasic test signal generator, or even a Fourier transform determinate waveform immotive multiphasic test signal generator whereby the Fourier transform and thus frequency content of a signal is known a priori. As mentioned above, a very low frequency signal such as might cause incremental movement (as opposed to a test) can be included. This can be superimposed as well with a high frequency immotive multiphasic test signal. In general, the test device (1) can cause generating a plurality of different frequency immotive multiphasic test signals, any or all of which can be separately issued or can be superimposed with each other or a movement signal.

One aspect that can be understood with respect to a rotor fault is the fact that depth indicia can exist. For example, lower frequency signals will penetrate a rotobar more deeply and thus can yield information—even if not quantitative—about a deeper fault. Thus embodiments can include a variable depth immotive multiphasic test waveform signal generator. The signals can be tailored to the component or effect of interest and so there can be a rotor component immotive multiphasic test waveform signal generator, a stator component immotive multiphasic test waveform signal generator, a first component optimized immotive multiphasic test waveform signal generator, a second component optimized immotive multiphasic test waveform signal generator, a first effect indicative immotive multiphasic test waveform signal generator, a second effect indicative immotive multiphasic test waveform signal generator, a depth effect indicative immotive multiphasic test waveform signal generator, or the like.

With respect to the sensor element or elements (11), the response of the machine can be sensed by a current sensor, a voltage sensor, or otherwise, thus, the sensor element(s) can be a variety of devices that serve as a multiphasic motive force electrical machine response sensor element (11). The sensed information can be returned to the test device (1) by a wire or can be wireless, and either capability can act as the sensor return (12). When configured or read for different faults, these can be considered as a magnetic core response sensor element, a rotor conductivity response sensor element, or a rotational eccentricity response sensor element. Multiple parameters can be sensed as well. In considering the sensor, as one may appreciate, if the test signal is a voltage, it may be best to sense current, and vice versa. Thus, the step of generating a voltage source immotive multiphasic test signal or a like generator can be associated with a current response immotive multiphasic test signal sensor element or the step of sensing a current response. Similarly, the step of generating a current source immotive multiphasic test signal or a like generator can be associated with a voltage response immotive multiphasic test signal sensor element or the step of sensing a voltage response. Sensing a power effect, sensing a voltage effect, sensing a current effect and similar elements should all be understood as within the ambit of this invention.

As mentioned, the multiphasic motive force electrical machine fault analyzer (16), can be configured to assess the existence of a fault in the multiphasic motive force electrical machine (6). It can be configured to sense any combination of or as any combination of a stator magnetization core fault analyzer (17), a rotor conductivity anomaly analyzer (18), or a rotational eccentricity fault analyzer (19). In observing and assessing varying test signals, it can serve as a comparative test analyzer (25). These varied signals can be particularly revealing when the test device (1) includes an immotive multiphasic test signal frequency variation controller that can vary a frequency of the immotive multiphasic test signal. In this instance, the analyzer should be configured as a frequency variation effect analyzer (23) so as to be able to discern the existence of a frequency variation effect. This frequency variation effect can be one that varies substantially with a frequency squared and so the analyzer can be configured as a frequency squared proportional effect analyzer. Similarly the analyzer can discern effects more subtle or less quantitative, such as discerning the existence of an effect that decreases with increasing frequency test signals or discerning the existence of an effect that increases with increasing frequency test signals.

Figure 4:
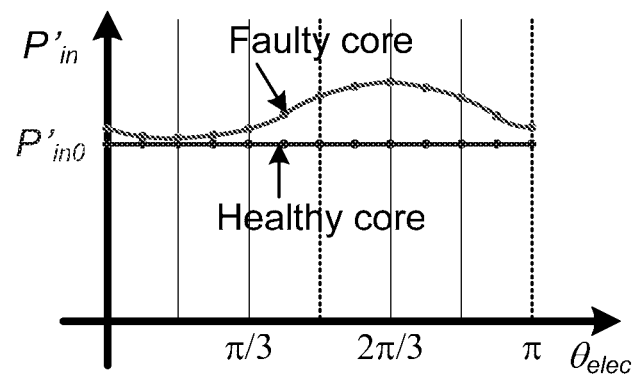
FIG. 4 is a plot comparing a power measurement as a function of angle and comparing faulty and healthy magnetic core components for a rotating multiphasic motive force electrical machine according to one embodiment of the invention.

The invention can provide a magnetic core anomaly tester. To excite the core without inducing torque in the machine, a pulsating AC magnetic field can be applied using the inverter, as shown in FIG. 1. The inverter switches may be operated so that the voltage vector (flux vector) is alternated between $\theta$ and $\theta+\pi$ to produce a pulsating field (if the flux vector angle, $\theta$, is 0°, the flux vector pulsates between the 0° and 180° position). The flux vector may be applied to a set of fixed locations, as shown in FIG. 4, and the input power may be measured at each location. The pulsating field induces voltage in the rotor bars causing current flow in the rotor, but the motor does not rotate since there is no torque induced. This results in I²R losses in the stator and rotor conductors and core losses in the stator and rotor core. It should be noted that the core loss in the rotor, $P_{c,r}$, is comparable to that of the stator, $P_{c,s}$, since the rotor is at standstill. For die-cast squirrel cage rotors, there will be significant inter laminar current flowing in the rotor laminations through the rotor bars and/or shaft, resulting in large rotor core losses. The input power, $P_{in}$, which is the sum of the loss components, can be calculated from the input voltage, $v_{abcs}$, and current, $i_{abcs}$, measurements as, $$P_{in} = P_s + P_r + P_{c,s} + P_{c,r} \qquad (eq\ 6)$$
$$= v_{as}i_{as} + v_{bs}i_{bs} + v_{cs}i_{cs}$$
$$= \frac{3}{2}(v_{qs}i_{qs} + v_{ds}i_{ds}).$$

In a preferred embodiment of the magnetic core anomaly tester invention, $P_{in}$ is calculated as a function of $\theta$ (ranging between 0 and 180 electrical degrees), and the pattern of $P_{in}$ vs. $\theta$ is observed to detect core problems that result in increase in hysteresis or eddy current losses.

Since an objective can be to monitor the core quality from the core loss measurements, the excitation and computation may be performed so that the change in stator core loss can be observed with high sensitivity. To maximize $P_{c,s}$, it can be seen in (eq3)-(eq4) that it can be advantageous to excite the core at high frequency, f, with high $B_{peak}$, to increase $P_h$ and $P_e$. This can improve the sensitivity of detecting an increase in $P_{c,s}$ due to core problems. For a given frequency, there is a limit to increasing $B_{peak}$ (voltage) due to the stator current limit and since the dc link voltage is fixed. Therefore, the core can be excited at a frequency higher than rated frequency to improve the sensitivity (typically at 250 Hz~1 kHz). Increasing the excitation frequency further could improve the sensitivity unless magnetic skin effect limits flux penetration. However, it may also increase the hardware requirements for accurate $P_{in}$ calculation (faster sampling frequency and increased computational burden). Therefore, the optimal excitation frequency could be determined based on the drive system specifications. Once $P_{in}$ is obtained, the non-critical stator copper loss can be estimated and separated from $P_{in}$ to improve the sensitivity to increase in core loss. This can be one way to eliminate non-critical effects and so embodiment can include a non-critical effect eliminator (45) or a resistance loss effect eliminator that can serve for separating out expected resistance loss effects or other noncritical effects such as a rotobar effect that is not magnified due to rotation.

The value of $P_s$ can be calculated from the current measurements and $R_s$ estimate, as shown in (eq1). The $R_s$ estimate can easily be obtained from a dc test performed on the stator winding using the inverter. Since it is difficult to separate $P_r$ or $P_{c,r}$, the compensated input, $P'_{in}$, consists of $P_r$, $P_{c,s}$, $P_{c,r}$, as shown in $$P'_{in} = P_r + P_{c,s} + P_{c,r} \qquad (eq\ 7)$$
$$= P_{in} - \hat{R}_s(i_{as}^2 + i_{bs}^2 + i_{cs}^2)$$
$$= P_{in} - \frac{3}{2}\hat{R}_s(i_{qs}^2 + i_{ds}^2),$$

where, $\hat{R}_s$ is the estimate of $R_s$.

To analyze the influence of an inter laminar stator core fault on the $P'_{in}$ vs. $\theta$ distribution, the cross section of an induction motor shown in FIG. 3 can be considered. If it is assumed that the stator winding is sinusoidally distributed, the spatial flux density distribution of the pulsating field in the airgap, $B_{gap}$, can be expressed analytically as $$B_{gap}(\omega t, \alpha\theta) = B_{peak} \sin \omega t \cdot \cos(\alpha-\theta), \quad (eq8)$$

where, $B_{peak}$ is the peak flux density, $\theta$ is the flux vector electrical angle, and $\alpha$ is the electrical angle with respect to the as-axis, as shown in FIG. 3. If an interlaminar short is present in the stator core, it is the flux in the yoke of the core that induces the eddy current causing additional losses. For an airgap pulsating field shown in (eq8), the flux density distribution in the yoke, $B_{yoke}$, can be derived as $$B_{yoke}(\omega t, \alpha, \theta) = B'_{peak} \sin \omega t \cdot \sin(\alpha-\theta). \quad (eq9)$$

It can be seen in (eq9) that the peak of $B_{yoke}$ is 90° (electrical) apart from the peak of the $B_{gap}$; therefore, if the flux vector is pointing towards the fault, $P'_{in}$ is at its minimum value since the yoke flux that induces the fault current is at its minimum. If the flux vector is pointing to a location 90° apart from the fault, $P'_{in}$ is at its maximum value since the yoke flux that induces fault current is at its maximum.

For an ideal healthy machine, $P'_{in}$ is constant and independent of the flux vector position ($P'_{in0}$), as shown in FIG. 4, since the motor is symmetrical. If an interlaminar stator core fault is present, the increase in $P'_{in}$, $\Delta P'_{in}$, depends on the relative location of the flux vector ($\theta$) with respect to the fault ($\theta_f$). Since the additional eddy current loss due to the fault is proportional to the square of the yoke flux, an approximate analytical equation of $P'_{in}$ can be derived from (eq4) and (eq9) as $$P'_{in}(\theta) = P'_{in0} + \Delta P'_{in}(\theta) \approx \quad (eq\ 10)$$
$$P'_{in0} + B'^{2}_{peak} + \sin^2(\theta - \theta_f) \approx P'_{in0} + \frac{B'^{2}_{peak}}{2}(1 - \cos 2(\theta - \theta_f))$$

at a given excitation frequency. The $P'_{in}$ measurements for a healthy core and a core with an interlaminar fault shown in FIG. 3, are shown in FIG. 4 as a function of $\theta$. For a core fault located in the 210° location (FIG. 3), the peak of $P'_{in}$ is located 90° apart from the fault (120°) as shown in FIG. 4 according to (eq10). It can be seen in the figure that local problems in the stator core can not only be detected, but also located by observing the loss distribution. Since the spatial distribution of the loss can be monitored, local core problems can be detected with higher sensitivity compared to core tests that monitor the average core condition. This is another major advantage of embodiments over the existing core tests described in the art. In addition to interlaminar core faults, any type of core problem that results in an increase in the core loss can be observed in the pattern of $P'_{in}$. Uniform deterioration in the laminations or inter laminar insulation would result in a uniform increase in $P'_{in}$.

Since it is the change in the $P'_{in}$ from the healthy $P'_{in0}$ that is being monitored, it is desirable to monitor the % increase in $P'_{in}(\theta)$, % $\Delta P'_{in}(\theta)$, shown in (11) for core quality assessment.

$$\% \Delta P'_{in}(\theta) = \frac{P'_{in}(\theta) - P'_{in0}}{P'_{in0}} \times 100\% \quad (eq\ 11)$$

Although it was assumed in (eq11) that $P'_{in0}(\theta)$ is constant, there is some small $\theta$ dependency in reality due to manufacturing imperfections and non-idealities in the core. Therefore, the $P'_{in}$ distribution with respect to the baseline measurement ($P'_{in0}(\theta)$), should be monitored whenever possible, to improve the sensitivity. The distribution of $P'_{in0}(\theta)$ and $P'_{in}(\theta)$ can be obtained for a fixed rotor position only if the test is performed off-line. The % increase in $P'_{in}(\theta)$, % $\Delta P'_{in}(\theta)$, in this case can be expressed as shown in (eq12).

$$\% \Delta P'_{in}(\theta) = \frac{P'_{in}(\theta) - P'_{in0}(\theta)}{P'_{in0}(\theta)} \times 100\% \quad (eq\ 12)$$

Figure 5:
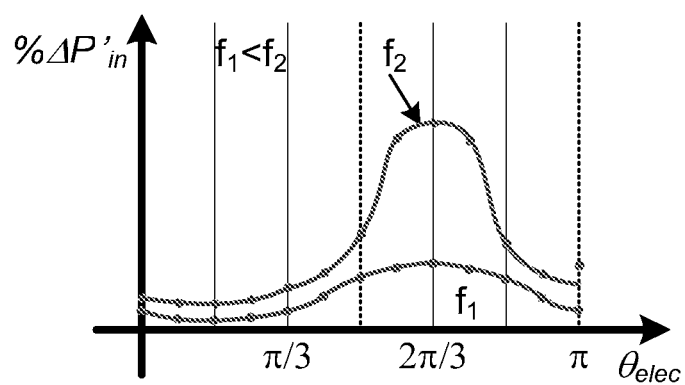
FIG. 5 is a plot similar to that of FIG. 4 with a normalized loss (% $\Delta P_{in}$) that shows the comparison of losses for two different frequencies of test signal ($f_1$ and $f_2$).

As can be appreciated from the above mathematical analysis, embodiments of the invention can provide a magnetic core anomaly tester. This invention can discern the existence of a stator magnetization core fault by including a stator magnetization core fault analyzer (17) that is configured to assess the existence of a magnetic core anomaly such as by a galvanically disconnected component magnetic field permeability fault analyzer. Such a fault can be sensed by a magnetic core response sensor element that can see responses of an interlaminar magnetic core fault. Such faults may even be discerned by the existence of a substantially frequency squared proportional effect as indicated in FIG. 5. Generally these faults may be manifested by a magnetic field loss effect or an eddy current effect.

Figure 6:
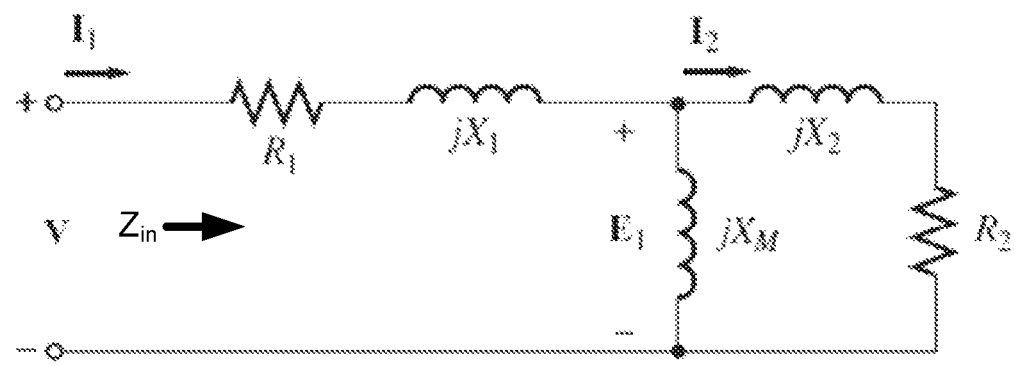
FIG. 6 is a schematic depiction of an equivalent circuit as may exist when there is a rotor conductivity anomaly present in a multiphasic motive force electrical machine.
Figure 7:
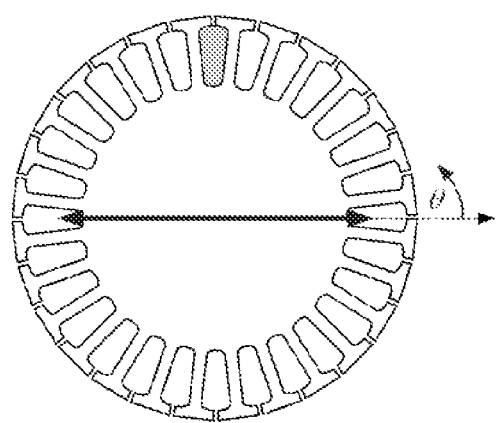
FIG. 7 is a cross sectional depiction of a rotor of a multiphasic motive force electrical machine showing the angular relation of the collection of rotobars in such a machine and depicting a field location that is 90° apart from the rotobar fault.
Figure 8:
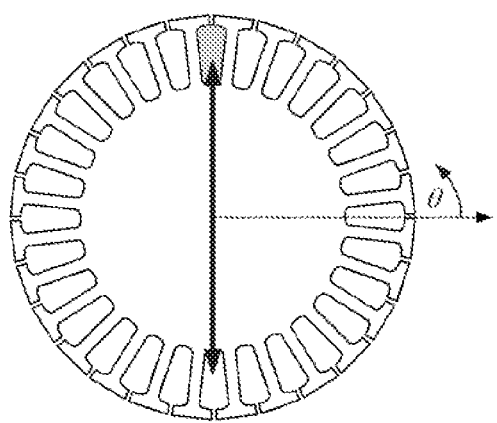
FIG. 8 is a cross sectional depiction as in FIG. 7 depicting a field location that is 0° apart from the rotobar fault.

The invention can also provide a rotor conductivity anomaly tester. Again, to excite the core without inducing torque in the machine, a pulsating AC magnetic field is applied using the inverter, as shown in FIG. 1. The responses can reveal the nature of the fault to be a rotor conductivity fault or the like. In this regard, it should be understood that as but one type of rotor conductivity fault, broken rotor bars, can account for 5~10% of induction machine failures. In the rotor conductivity invention, the inverter hardware can be used to excite the motor in a similar fashion as the stator core fault detector, but at a lower frequency. The equivalent circuit of the motor under this excitation can be derived as shown in FIG. 6 since the slip of the machine is equal to one. If the fluctuating field is 90 degrees apart relative to the location of the broken bar, as shown in FIG. 7, the current induced in the broken bar is supposed to be the largest, but will be missing. This results in an increase in the effective rotor resistance, $R_2$, and leakage inductance, $X_2$, when compared to a healthy rotor. This will increase the resistive and reactive components of the equivalent input impedance of the motor, $Z_{in}=V/I_1$, shown in FIG. 6. If the fluctuating field is 0 degrees apart relative to the location of the broken bar, as shown in FIG. 8, the current induced in the broken bar is close to zero. Therefore, the effective rotor resistance, $R_2$, and leakage inductance, $X_2$, and the resistive and reactive components of the equivalent input impedance of the motor, $Z_{in}$, will not change much (slight increase) compared to a healthy rotor.

Figure 9:
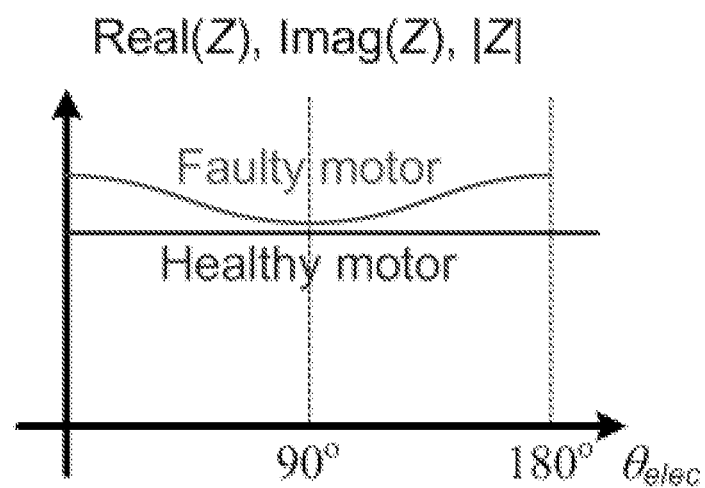
FIG. 9 is a plot of impedance as a function of field position for faulty and healthy rotor components.
Figure 10:
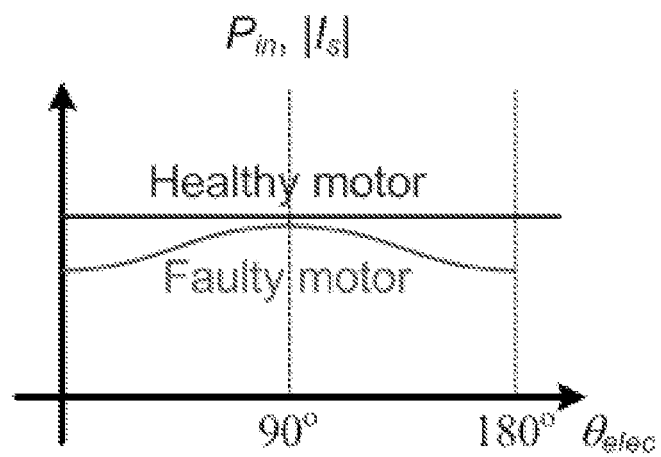
FIG. 10 is a plot similar to that of FIG. 9 showing parameters of power for a constant voltage excitation by an immotive multiphasic test signal at different angular locations.

The equivalent impedance and power can be calculated from the voltage and current measurements at each location of the field. Since the resistance and reactive components increase when the field is at 0 and 180 degrees, as shown in FIG. 7, and does not change much (slight increase) when the field is located at 90 degrees, as shown in FIG. 8, the pattern of the impedance plot as a function of field position can be predicted, as shown in FIG. 9. For a constant voltage excitation at different locations of $\theta$, the current and power will decrease at 0 and 180 degrees since the impedance increases, as shown in FIG. 10. Therefore, the real or imaginary part of the impedance, the magnitude, angle of the impedance, real or reactive power, or the current magnitude pattern as a function of field position can be used as an indicator of broken bar or other rotor conductivity problems.

As can be appreciated from the above, embodiments of the invention can provide a rotor conductivity anomaly tester. This invention can discern the existence of a rotor conductivity anomaly by including a rotor conductivity anomaly analyzer (18) that is configured to assess the existence of a rotor conductivity anomaly such as a broken rotobar, a rotor resistance anomaly, a rotor circuit resistance anomaly, a motor brush imbalance anomaly, or even a a motor diode bridge anomaly. Such a fault can be sensed by a rotor conductivity response sensor element that can see responses of any of the above mentioned faults. Such faults may even be discerned by the existence of an effect that decreases with increasing frequency test signals and even by including a decrease with increasing frequency test signal effect analyzer. As mentioned earlier, a rotobar fault depth indicia analyzer can include assessing the existence of some type of rotobar fault depth indicia.

Yet another type of tester that can be provided is a rotational eccentricity fault tester. This type of tester can assess rotor eccentricity, which is the state where the center of the rotor rotation and center of stator are not aligned in some manner. This can be caused due to ovality of core, bent shaft, shaft misalignment, bearing damage, or unbalanced magnetic pull. There is always some degree of static eccentricity in a machine as an eccentricity within 10% is acceptable as manufacturing tolerance. Static eccentricity can lead to dynamic eccentricity, however, and can eventually cause stator-rotor rub, which will cause irreversible damage to the machine.

There are both off-line and on-line methods for detecting eccentricity faults. The single phase rotation test described for rotor bar detection can also be used for detecting eccentricity, but this test requires manual rotor rotation and a proximity to the motor, which makes it inconvenient. The feeler gauge "out-of-round "test, and total indicated reading (TIR) tests are also available for detecting eccentricity off-line with the motor disassembled.

Since eccentricity causes permeance variation in the airgap, it results in an asymmetric flux in the airgap. Motor eccentricity can also be detected on-line by analyzing the spectrum of vibration, torque, flux, or current. The eccentricity characteristic frequency can be monitored in these waveforms to detect the problem. However, the cost is high due to the requirement of permanently installing dedicated equipment to the machines, and because on-line methods often rely on speed information, and therefore are difficult to apply to rapidly varying load or speed applications. As in broken bar detection, eccentricity can be confused with load signatures.

Again the excitation method is from a device as shown in FIG. 1 and is conceptually similar to the stator core fault and rotor conductivity detectors. These can be applied for detecting eccentricity since the spatial variation of airgap permeance due to eccentricity will cause variations in magnetizing and leakage inductances and magnetic saturation. Therefore, the spatial variations in impedance, power, or current can be used for detecting static and dynamic eccentricity. A rotational eccentricity fault tester can discern the existence of an eccentricity fault by including a rotational eccentricity fault analyzer (19) that is configured to stimulate and then to analyze the existence of an eccentricity response. Such a fault can be sensed by a rotational eccentricity fault sensor element that can see responses due to an eccentricity fault. Such faults may even be discerned by the existence of an effect that increases with increasing frequency test signals and as such embodiments may include an increase with increasing frequency test signal effect analyzer. The rotational eccentricity fault analyzer (19) may serve as a static eccentricity anomaly condition analyzer or a dynamic eccentricity anomaly condition analyzer.

As may be appreciated from the above, movement within the motive force electrical machine can be used to yield information. Movement can be of any component or merely of a field. The test device can include a movement signal generator (33) since the signal generator can achieve the movement. It can also include a locational variation effect analyzer (24) to determine the effect of the movement. This can be facilitated by an immotive multiphasic machine angle test signal controller that acts to vary a machine angle, such as in a rotational machine, for the immotive multiphasic test signal. This movement can occur in between applications of the test signal, and so the controller can serve as an interstitial angle change multiphasic machine angle test signal change controller (35) where movement occurs in between two applications of desired, perhaps identical test signals. Similarly movement can occur simultaneous to a perhaps much faster test. Thus embodiments can include a simultaneous angle change multiphasic machine angle test signal change controller (36) that can act during the application of test signals. Of course after such movement, the analyzer can serve as a comparative test analyzer (25) to see the differences due to such movement. For rotating electrical motors and the like, the controller can be configured as a multiphasic motive force electrical machine rotor movement controller (42). This movement can be sequential and can step around a half circle for example. Thus embodiments can include a sequential multiphasic motive force electrical machine magnetization location incrementor (9) and can provide for multiply incrementing a movement of a component. Movement can be only of the magnetization plane as well and the controller can be configured as an immotive multiphasic machine magnetization location change controller (43) that acts to change a magnetization location. This can be stepped around as well and so there can be the act of multiply incrementing a change of magnetization location. Increments to create incremented immotive multiphasic test signals can occur in a variety of steps such as: about five degree increments, about a rotor segment increment, about a stator segment increment, and about one hundred eighty degree total incremental movement.

Also the magnetic field can be varied by altering current or voltage or the like and such can be determined from known parameters of a particular test motor, test circuitry, or the like. Thus, the controller can be configured as an immotive multiphasic test signal magnetic field intensity factor variation controller which can be adapted to a specific machine, of course. Magnetic fields of 0.33 T, 0.50 T, 0.67 T, 1.0 T, or 1.33 T can be generated.

Figure 11:
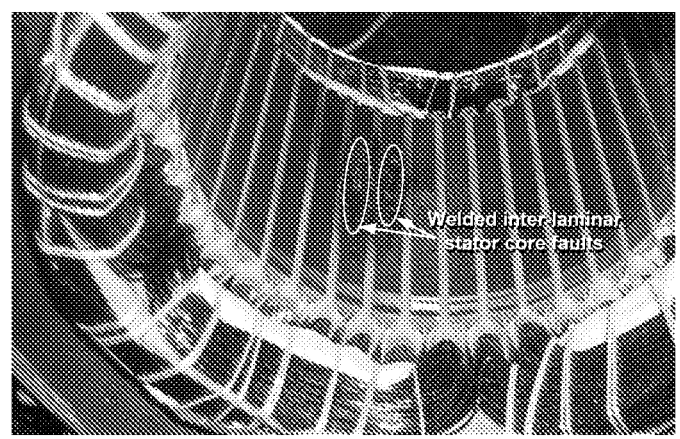
FIG. 11 is a depiction of a representative stator core fault in a rotating multiphasic motive force electrical machine.

To verify the validity of the proposed inventions, an experimental study was performed on a 4P, 380V, 10 hp, aluminum die-cast squirrel cage rotor induction motor. A 600V, 15A inverter was constructed in the lab, and a commercial DSP (TMS320F2808) was used for controlling the inverter to excite the machine with pulsating magnetic fields. To simulate interlaminar core faults, a number of faults with varying severity were introduced on the tooth tip by welding the stator bore, as shown in FIG. 11. Approximately half of the axial core length of 2 and 4 slots was welded at the 210° location (phase B winding slot in FIG. 3). The stator core was tested using the proposed technique before and after introducing the faults to observe the change in the pattern of $P'_{in}(\theta)$. In addition to the proposed technique, the core loss test and the IEEE 112B no load segregation test (with segregation of $P_s$) were also performed for comparison of results. When performing the core tests, the input power was calculated from the voltage and current measurements, and a commercial IR thermal imaging camera was used for measuring the temperature rise and distribution during the core loss test.

Figure 12:
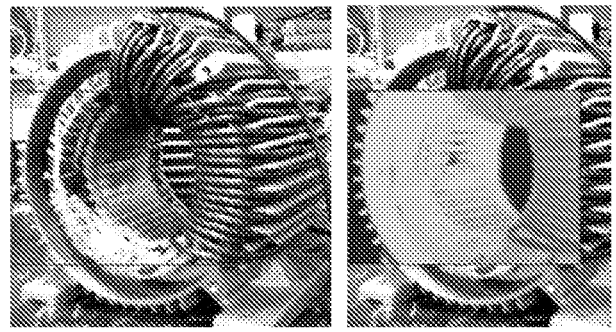
FIG. 12 (a, left, and b, right) are depictions of a stator core for a loss test in visual and infrared depictions.
Figure 13:
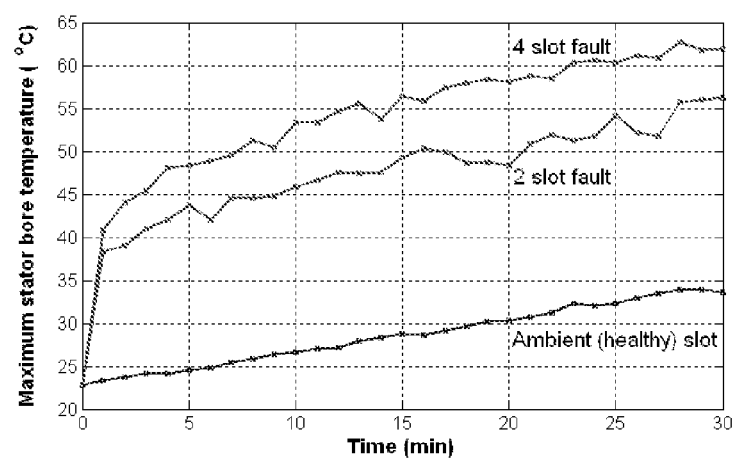
FIG. 13 shows experimental results of temperature increase over time for the above stator core.
Figure 14:
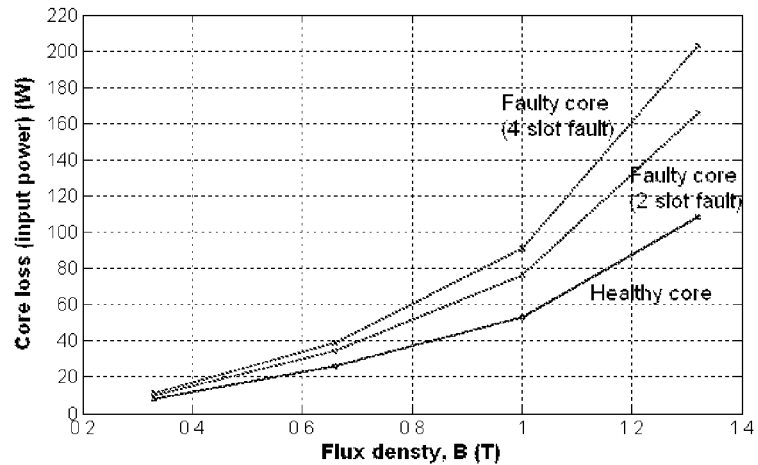
FIG. 14 shows experimental results of core loss as a function of yoke flux density comparing a healthy and two faulty cores.

From this, a stator core loss (loop) test was performed on the motor with the core excited at 0.33, 0.66, 1.0, and 1.32 T before and after inserting the two different types of faults, as shown in FIG. 12. The change in the temperature distribution at 1.32 T was measured using an IR camera for 30 minutes in 1 minute intervals. The ambient (healthy) stator bore and maximum hot spot temperature under the 2 slot and 4 slot fault conditions are shown in FIG. 13. It can be seen that the temperature rise above ambient at the hot spot was approximately 20° C. and 28° C. for the two faults, respectively. The core loss was also calculated from the excitation coil input voltage and current after separating the stator $I^2R$ loss, before and after fault insertion. The measured core loss as a function of yoke flux density for the healthy and faulty core is summarized in FIG. 14. It can be seen that the core loss increases with flux density and with fault insertion. The increase in core loss was 53.3% and 97.9% for 2 and 4 slot faults, respectively. Since it is recommended that a fault with a hot spot 10° C. above ambient or 5% increase in core loss should be fixed, the inserted faults are serious defects that require immediate repair or replacement.

Figure 15:
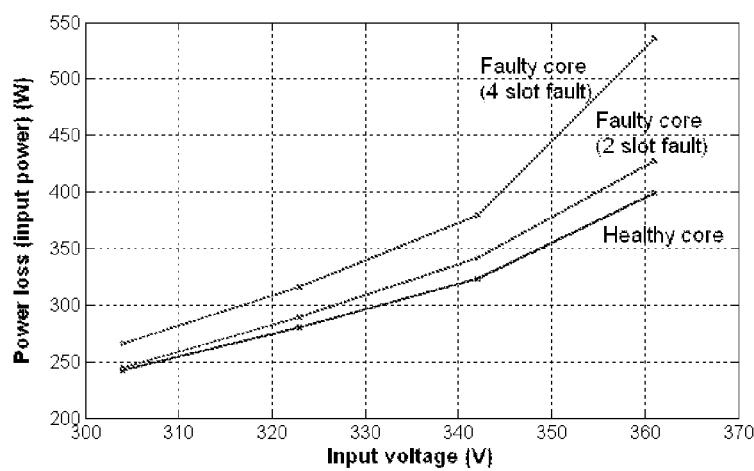
FIG. 15 shows experimental results of no load power loss as a function of input voltage and also comparing a healthy and two faulty cores.

The input power loss under no load conditions was calculated from the stator input voltage and current after separating the stator $I^2R$ loss, before and after fault insertion. The no load loss is shown in FIG. 15 as a function of stator voltage for the healthy and faulty stator core. It can be seen that the losses increase by 7.2% and 34.25% at rated voltage for 2 slot and 4 slot faults, respectively. The increase in the no load loss (with $P_s$ separated) indicates that there is a problem in the core that results in an increase in the losses. It can be seen that the core loss test is more sensitive than the no load test since it results in a larger % increase in losses under the same fault condition. This is because the $P_s$ is the only type of loss being measured in the core loss test, whereas the $P_{f\&w}$, and $P_{stray}$ that result from rotation are also measured in addition to $P_s$ in the no load test. The results of the two tests clearly show that the fault inserted in the core results in an increase in the core loss.

Figure 16:
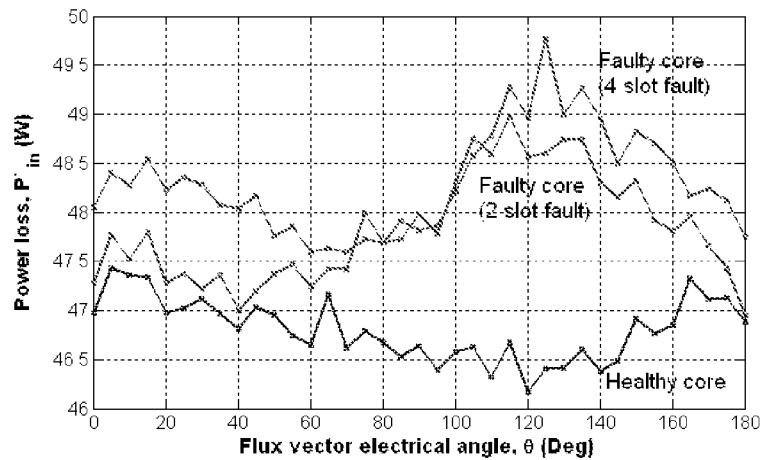
FIG. 16 shows experimental results of power loss as a function of applied magnetic field angle for a test signal having a 1000 Hz frequency and also comparing a healthy and two faulty cores.
Figure 17:
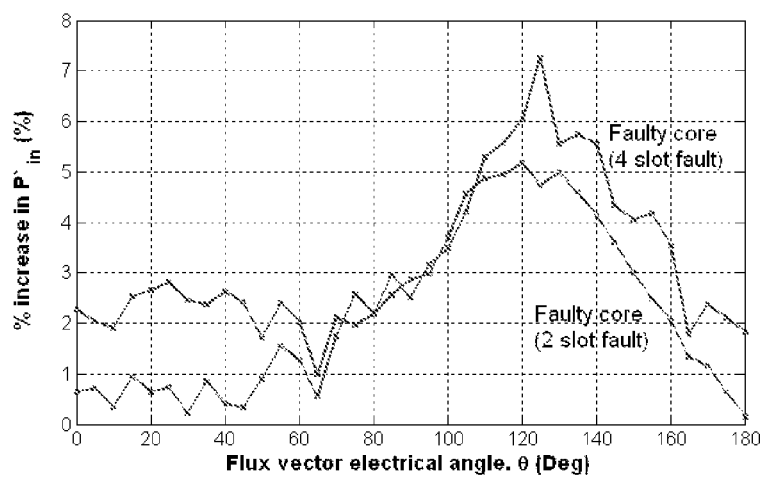
FIG. 17 shows experimental results of percentage increase in power as a function of applied magnetic field angle for a test signal having a 1000 Hz frequency for two faulty cores.
Figure 18:
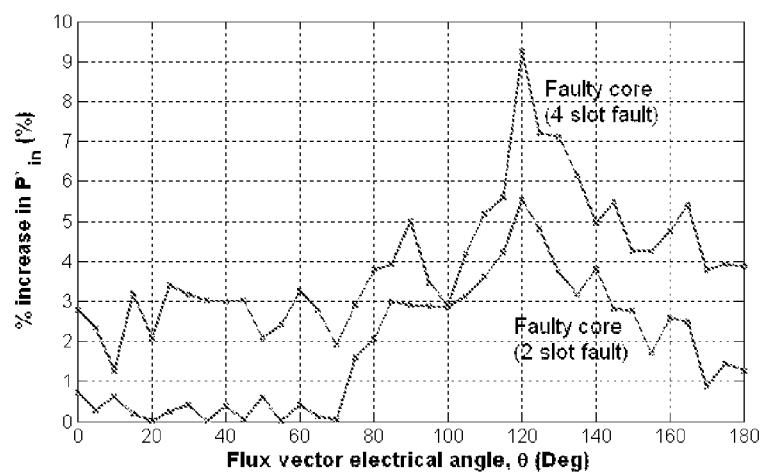
FIG. 18 shows experimental results similar to those depicted in FIG. 17 but with a 500 Hz frequency for two faulty cores.

To further test the proposed technique, the core was excited with 500 Hz and 1 kHz pulsating vectors. The inverter was operated with constant duty cycle bipolar PWM switching at 10 kHz to produce the flux vectors. The pulsating flux vector angle was varied as above between 0 and 180 electrical degrees and each successively incremented as discussed above in 5 degree or other intervals (also as discussed above), to observe the power loss as a function of flux position. The power loss was calculated from the phase, voltage, and currents and nominal stator resistance value based on (eq6)-(eq7). The input power, $P'_{in}$ is shown in FIG. 16 for the healthy and faulty stator core as a function of flux vector angle when the excitation frequency is 1 kHz. It can be seen that there is a noticeable increase in the power loss after fault insertion, and the pattern of the loss is as predicted in FIG. 4. The peak of $P'_{in}$ is located at 120° (90° apart from the fault location), as predicted. It can also be seen that the power loss of the healthy stator core, $P_0$, is not constant as a function of flux angle due to manufacturing imperfections in the motor. The % increase in the power loss, % $\Delta P'_{in}$, after fault insertion, is shown in FIGS. 17-18 for 1 kHz and 500 Hz excitation, respectively. It can be clearly seen that local core problems that increase the core loss can be detected with high sensitivity by observing the magnitude and pattern of the power loss. The % increase in the power loss is small compared to the core loss and no load tests because the rotor $I^2R$ loss and rotor core losses, $P_r$ and $P_{c,r}$, are also included in the losses. Although the % increase in the fault indicator, % $\Delta P'_{in}$, is smaller than that compared to existing techniques, additional information can be obtained from its pattern. Monitoring the pattern of the loss spatial distribution provides sensitive indications on local core problems compared to existing methods that monitor the average core condition.

As the above examples show, the inventive techniques for monitoring the existence, location, and severity of faults can be implemented based on the voltage and current measurement. With these methods, the maintenance costs and safety risks can also be reduced. Embodiments can help improve the reliability, efficiency, and safety of the industrial facility. A simple technique for monitoring the quality of the stator core and rotor for inverter-fed induction machines is shown. By operating the inverter to excite the core or rotor with a set of high or low frequency pulsating fields at a set of fixed locations whenever the motor is at standstill information can be discerned. The power loss measured as a function of flux vector position is monitored to detect stator core problems that result in increase in core loss for stator core quality assessment.

The proposed inventions can be implemented in an inverter as a stand-alone diagnostics equipment for quality assurance (manufacturing) or machine inspection (machine shop/field). Whether implemented in an inverter or used as stand-alone equipment, the proposed technique has the following advantages over the core loss test or IEEE 112B loss segregation test that are currently accepted in industry:

Frequent assessment of core condition: core can be tested automatically whenever motor is shutdown.

Motor disassembly or rotor removal not required: testing can be performed with motor assembled Operation of motor not required: testing is performed at motor standstill Sensitive to local stator core problems: monitoring the loss spatial distribution provides a sensitive indication on local core problems compared to methods that monitor the average core condition Physical proximity to the motor not required: access to motor is not required for testing (this makes testing safe and convenient at hazardous locations)

The proposed technique is expected to help improve the reliability and efficiency of the motor and allow maintenance to be performed in a more flexible and efficient manner, since the core or rotor can be tested frequently whenever the motor is stopped.

As can be easily understood from the foregoing, the basic concepts of the present invention may be embodied in a variety of ways. It involves both test techniques as well as devices to accomplish the appropriate testing. In this application, the various techniques are disclosed as part of the results shown to be achieved by the various devices described and as steps which are inherent to utilization. They are simply the natural result of utilizing the devices as intended and described. In addition, while some devices are disclosed, it should be understood that these not only accomplish certain methods but also can be varied in a number of ways. Importantly, as to all of the foregoing, all of these facets should be understood to be encompassed by this disclosure.

The reader should be aware that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Apparatus claims may not only be included for the device described, but also method or process claims may be included to address the functions the invention and each element performs. Neither the description nor the terminology is intended to limit the scope of the claims that will be included in any subsequent patent application.

It should also be understood that a variety of changes may be made without departing from the essence of the invention. Such changes are also implicitly included in the description. They still fall within the scope of this invention. A broad disclosure encompassing both the explicit embodiment(s) shown, the great variety of implicit alternative embodiments, and the broad methods or processes and the like are encompassed by this disclosure. With this understanding, the reader should be aware that this disclosure is to be understood to support any subsequently filed patent application that may seek examination of as broad a base of claims as deemed within the applicant's right and may be designed to yield a patent covering numerous aspects of the invention both independently and as an overall system.

Further, each of the various elements of the invention and claims may also be achieved in a variety of manners. Additionally, when used or implied, an element is to be understood as encompassing individual as well as plural structures that may or may not be physically connected. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled. As but one example, it should be understood that all actions may be expressed as a means for taking that action or as an element which causes that action. Similarly, each physical element disclosed should be understood to encompass a disclosure of the action which that physical element facilitates. Regarding this last aspect, as but one example, the disclosure of a "sensor" should be understood to encompass disclosure of the act of "sensing"—whether explicitly discussed or not—and, conversely, were there effectively disclosure of the act of "sensing", such a disclosure should be understood to encompass disclosure of a "sensor" and even a "means for sensing" Such changes and alternative terms are to be understood to be explicitly included in the description.

Any patents, publications, or other references mentioned in this application for patent are hereby incorporated by reference. Any priority case(s) claimed by this application is hereby appended and hereby incorporated by reference. In addition, as to each term used it should be understood that unless its utilization in this application is inconsistent with a broadly supporting interpretation, common dictionary definitions should be understood as incorporated for each term and all definitions, alternative terms, and synonyms such as contained in the Random House Webster's Unabridged Dictionary, second edition are hereby incorporated by reference. Finally, all references listed in the list of References To Be Incorporated By Reference In Accordance With The Provisional Patent Application or other information statement filed with the application are hereby appended and hereby incorporated by reference, however, as to each of the above, to the extent that such information or statements incorporated by reference might be considered inconsistent with the patenting of this/these invention(s) such statements are expressly not to be considered as made by the applicant(s).

Thus, the applicant(s) should be understood to have support to claim and make a statement of invention to at least: i) each of the test devices as herein disclosed and described, ii) the related methods disclosed and described, iii) similar, equivalent, and even implicit variations of each of these devices and methods, iv) those alternative designs which accomplish each of the functions shown as are disclosed and described, v) those alternative designs and methods which accomplish each of the functions shown as are implicit to accomplish that which is disclosed and described, vi) each feature, component, and step shown as separate and independent inventions, vii) the applications enhanced by the various systems or components disclosed, viii) the resulting products produced by such systems or components, ix) each system, method, and element shown or described as now applied to any specific field or devices mentioned, x) methods and apparatuses substantially as described hereinbefore and with reference to any of the accompanying examples, xi) the various combinations and permutations of each of the elements disclosed, xii) each potentially dependent claim or concept as a dependency on each and every one of the independent claims or concepts presented, and xiii) all inventions described herein. In addition and as to computer aspects and each aspect amenable to programming or other electronic automation, the applicant(s) should be understood to have support to claim and make a statement of invention to at least: xvi) processes performed with the aid of or on a computer as described throughout the above discussion, xv) a programmable apparatus as described throughout the above discussion, xvi) a computer readable memory encoded with data to direct a computer comprising means or elements which function as described throughout the above discussion, xvii) a computer configured as herein disclosed and described, xviii) individual or combined subroutines and programs as herein disclosed and described, xix) the related methods disclosed and described, xx) similar, equivalent, and even implicit variations of each of these systems and methods, xxi) those alternative designs which accomplish each of the functions shown as are disclosed and described, xxii) those alternative designs and methods which accomplish each of the functions shown as are implicit to accomplish that which is disclosed and described, xxiii) each feature, component, and step shown as separate and independent inventions, and xxiv) the various combinations and permutations of each of the above.

With regard to claims whether now or later presented for examination, it should be understood that for practical reasons and so as to avoid great expansion of the examination burden, the applicant may at any time present only initial claims or perhaps only initial claims with only initial dependencies. The office and any third persons interested in potential scope of this or subsequent applications should understand that broader claims may be presented at a later date in this case, in a case claiming the benefit of this case, or in any continuation in spite of any preliminary amendments, other amendments, claim language, or arguments presented, thus throughout the pendency of any case there is no intention to disclaim or surrender any potential subject matter. It should be understood that if or when broader claims are presented, such may require that any relevant prior art that may have been considered at any prior time may need to be re-visited since it is possible that to the extent any amendments, claim language, or arguments presented in this or any subsequent application are considered as made to avoid such prior art, such reasons may be eliminated by later presented claims or the like. Both the examiner and any person otherwise interested in existing or later potential coverage, or considering if there has at any time been any possibility of an indication of disclaimer or surrender of potential coverage, should be aware that no such surrender or disclaimer is ever intended or ever exists in this or any subsequent application. Limitations such as arose in Hakim v. Cannon Avent Group, PLC, 479 F.3d 1313 (Fed. Cir 2007), or the like are expressly not intended in this or any subsequent related matter. In addition, support should be understood to exist to the degree required under new matter laws—including but not limited to European Patent Convention Article 123(2) and United States Patent Law 35 USC 132 or other such laws—to permit the addition of any of the various dependencies or other elements presented under one independent claim or concept as dependencies or elements under any other independent claim or concept. In drafting any claims at any time whether in this application or in any subsequent application, it should also be understood that the applicant has intended to capture as full and broad a scope of coverage as legally available. To the extent that insubstantial substitutes are made, to the extent that the applicant did not in fact draft any claim so as to literally encompass any particular embodiment, and to the extent otherwise applicable, the applicant should not be understood to have in any way intended to or actually relinquished such coverage as the applicant simply may not have been able to anticipate all eventualities; one skilled in the art, should not be reasonably expected to have drafted a claim that would have literally encompassed such alternative embodiments.

Further, if or when used, the use of the transitional phrase "comprising" is used to maintain the "open-end" claims herein, according to traditional claim interpretation. Thus, unless the context requires otherwise, it should be understood that the term "comprise" or variations such as "comprises" or "comprising", are intended to imply the inclusion of a stated element or step or group of elements or steps but not the exclusion of any other element or step or group of elements or steps. Such terms should be interpreted in their most expansive form so as to afford the applicant the broadest coverage legally permissible. The use of the phrase, "or any other claim" is used to provide support for any claim to be dependent on any other claim, such as another dependent claim, another independent claim, a previously listed claim, a subsequently listed claim, and the like. As one clarifying example, if a claim were dependent "on claim 20 or any other claim" or the like, it could be re-drafted as dependent on claim 1, claim 15, or even claim 715 (if such were to exist) if desired and still fall with the disclosure. It should be understood that this phrase also provides support for any combination of elements in the claims and even incorporates any desired proper antecedent basis for certain claim combinations such as with combinations of method, apparatus, process, and the like claims.

Finally, any claims set forth at any time are hereby incorporated by reference as part of this description of the invention, and the applicant expressly reserves the right to use all of or a portion of such incorporated content of such claims as additional description to support any of or all of the claims or any element or component thereof, and the applicant further expressly reserves the right to move any portion of or all of the incorporated content of such claims or any element or component thereof from the description into the claims or vice-versa as necessary to define the matter for which protection is sought by this application or by any subsequent continuation, division, or continuation-in-part application thereof, or to obtain any benefit of, reduction in fees pursuant to, or to comply with the patent laws, rules, or regulations of any country or treaty, and such content incorporated by reference shall survive during the entire pendency of this application including any subsequent continuation, division, or continuation-in-part application thereof or any reissue or extension thereon.

LIST OF REFERENCES

I. U.S. PATENT DOCUMENTS

| DOCUMENT NO. & KIND CODE (if known) | PUB'N DATE mm-dd-yyyy | PATENTEE OR APPLICANT NAME |
|---|---|---|
| U.S. Pat. No. 6,847,224b2 | Jan. 25, 2005 | Lee, et al |

II. FOREIGN PATENT DOCUMENTS

| Foreign Patent Document | PATENTEE OR APPLICANT NAME |
|---|---|

III. NON-PATENT LITERATURE DOCUMENTS

A. V. Jouanne, B. Banerjee, "Assessment of Voltage Unbalance," IEEE Trans. Power Delivery, vol. 16, pp. 782, October 2001.
D. Como, "Threading your way into a solid connection," Plant Services [Online], Available: http://www.plantservices.com/articles/2003/236.html, February 2007
J. Schlabbach, D. Blume, T. Stephanblome, Voltage Quality in Electrical Power Systems, IEE Power and Energy Series 36, London, 2001, pp. 147-149.
N. Mohan, T. M. Undeland, W. P. Robbins, "Power Electronics," 2nd ed., New York: Wiley, 1995, p. 435.
J. Arrillaga, N. R. Watson, "Power System Harmonics," 2nd ed., New York: Wiley, 2004, p. 196.
D. William, Jr. Stevenson, "Elements of Power System Analysis," 4th ed., New York: McGraw-Hill, 1982, p. 252.
Baker Instrument Company, "Advanced Winding Analyzer IV - Users Manual," 71-015 Rev D., Fort Collins, CO, 2007, p. 62.
"Electric Motor Predictive and Preventive Maintenance Guide," EPRI, San Francisco, CA, Tech. Rep. NP-7502 (2814-35), 1992, p. 3-7.
"Electric Motor Predictive and Preventive Maintenance Guide," EPRI, San Francisco, CA, Tech. Rep. NP-7502 (2814-35), 1992, p. 4-3.
"Troubleshooting of Electric Motors," EPRI, San Francisco, CA, Final Rep. 1000968,

III. NON-PATENT LITERATURE DOCUMENTS

December 2000, p. B-19 CA3.
"Troubleshooting of Electric Motors," EPRI, San Francisco, CA, Final Rep. 1000968, December 2000, p. 6-4.
FLIR Homepage, [Online], Available: http://www.flir.de/success/ir_image/1207/industry_id/1001/, February 2007.
Motors and Generators, NEMA Standards Publication MG 1, 20.24.5, 2006.
Motors and Generators, NEMA Standards Publication MG 1, FIG. 20-2, 2006.
Energy Management Guide For Selection And Use Of Polyphase Motors, NEMA Standards Publication MG 10, Table 2-1, 1994.
Energy Management Guide For Selection And Use Of Polyphase Motors, NEMA Standards Publication MG 10, 2.1.2 g), 1994.
J. Bockstette, E, Stolz, E. Wiedenbrug, "Upstream Impedance Diagnostic for Three-Phase Induction Motors" 2007.
J. Yoon, J. Yun, S. B. Lee, E. J. Wiedenbrug, "Automated Monitoring of High-Resistance Connections in the Electrical Distribution System of INdustrial Facilities," Proceedings of IEEE IAS (Industrial Applications Society) Annual Meeting, Edmonton, Alberta, Oct. 5, 2008.
D. Almand, "Fault zone analysis - power circuit," Proc. of the PDMA Motor Reliability Technical Conference, 2004., [Online] Available: http://www.pdma.com/oldart.html.
R. Newport, "The loose electrical connection myth," Maintenance Technology, February 1998. [Online] Available: http://www.mt-online.com/articles.
G. A. McCoy, and J. G. Douglass, Energy management for motor driven systems, Office of Industrial Technologies, U.S. Department of Energy, 2000. [Online] Available: http://www1.eere.energy.gov/industry/best practices/techpubs_motors.html.
Washington State Energy Office, Keeping the spark in your electrical system, October 1995.
Bonneville Power Administration, Electrical distribution system tune-up, January 1995.
G. C. Stone, E. A. Boulter, I. Culbert, and H. Dhirani, Electrical Insulation for Rotating Electrical Machines, IEEE Press, Piscataway, NJ, 2004.
J. J. Shea, "Conditions for series arcing phenomena in PVC wiring," Proc. of the IEEE Holm Conference on Electrical Contacts, pp. 167-175, September 2005.
J. Sletbak, R. Kristensen, H. Sundklakk, G. Navik, and M. Runde, "Glowing contact areas in loose copper wire connections," IEEE Transactions on Components, Hybrids, and Maufacturing Technology, vol. 15, no. 3, pp. 322-327, June 1992.
R. S. Colby, "Detection of high-resistance motor connections using symmetrical component analysis and neural networks," Proc. of IEEE SDEMPED, pp. 2-6, Atlanta, GA, 2003
J. Yun, J. Cho, S. B. Lee, and J. Yoo, "On-line Detection of High- Resistance Connections in the Incoming Electrical Circuit for Induction Machines," Proc. of IEEE-IEMDC, vol. 1, pp. 583-589, Antalya, Turkey, 2007.
J. J. Grainger, and W. D. Stevenson, Power System Analysis, McGraw- Hill, New York, 1994.
G. B. Kliman, W. J. Premerlani, R. A. Koegl, and D. Hoeweler, "A new approach to on-line turn fault detection in ac motors," Proc. IEEE-IAS Annual Meeting, vol. 1, pp. 687-693, 1996.
Lee, Sang Bin; Kliman, Gerald B; Shah, Manoj r; Nair, N Kutty; Lusted, R. Mark; "An Iron Core Probe Based Inter-Laminar Core Fault Detection Technique for Generator Stator Cores," IEEE Transactions on Energy Conversion, Vol. 20, No. 2, June 2005.
Lee, Sang Bin; Kliman, Gerald B; Shah, Manoj R; Mall, W. Tony; Nair, N. Kutty; Lusted, R. Mark; "An Advanced Technique for Detecting Inter-Laminar Stator Core Faults in Large Electric Machines," IEEE Transactions on Industry Applications, Vol. 41, No. 5, September/October 2005.
Kral, C; Pirker, F; Pascoli, G; "Model Based Detection of Rotor Faults without Rotor Position Sensor - the Sensorless Vienna Monitoring Method," Symposium on Diagnostics for Electric Machines, Power Electronics and Drives, Atlanta, GA pp 24-26, August 2003.
Schoen, Randy R; Lin, Brian K; Habetler, Thomas G; Schlag, Jay H; Farag, Samir; "An Unsupervised, On-line System for Induction Motor Fault Detection Using Stator Current Monitoring," IEEE Transactions on Industry Applications, Vol. 31, No. 6, November/December 1995.
Cabanas, M. F.; Gonzalez, J. L. Ruis; Sampayo, J. L. B.; Melero, M. G.; Rojas, C. H.; Pedrayes, F; Arguelles, A; Vina, J., "Analysis of fatigue causes on rotor bars of squirrel cage asynchronous motors: experimental analysis and modeling of medium voltage motors," SDEMPED 2003, Atlanta, GA, August 2003.
Schoen, Randy R; Habetler, Thomas G., "Evaluation and Implementation of a System to Eliminate Arbitrary Load Effects in Current-Based Monitoring of Induction Machines," IEEE Transactions on Industry Applications, Vol. 33, No. 6, November/December 1997.
Kostic-Perovic, Dragica; Arkan, Muslum; Unsworth, Peter; "Induction Motor Fault Detection by Space Vector Angular Fluctuation," School of Engineering, University of Sussex, 2000 IEEE.
Kang, Dong-Sik; Korea Electrotechnology Research Institute Presentation; "Introduction of KERI".
McCully, P. J.; Landy, C. F.; "Evaluation of Current and Vibration Signals for Squirrel Cage Inductor Motor Condition Monitoring," University of Witwatersrand, South Africa, Conference publication No. 444; September 2007.
Delpray, Nathalie; Escudie, Bernard; Guillemain, Philippe; Kronland-Martinet, Richard; Tchamitchian, Philippe; Torresani, Bruno; "Asymptotic Wavelet and Gabor Analysis: Extraction of Instantaneous Frequencies," IEEE Transactions on Information Theory,

III. NON-PATENT LITERATURE DOCUMENTS

Vol. 38, No. 2, March 1992.

Yazici, Birsen; Kliman, Gerand; Premerlani, William; Koegl, Rudolph; Abdel-Malek, Aiman; "An Adaptive, On-line Statistical Method for Detection of Broken Bars in Motors Using Stator Current and Torque Estimation; IEEE Industrial Applications Society Annual Meeting, New Orleans, Oct. 5-9, 1997.

Carmona, Rene; Hwang, Wen; Torresani, Brun; "Characterization of Signals by the Ridges of their Wavelet Transforms," IEEE Transactions on Signal Processing, Vol. 45, No. 10, October 1997.

Manolas, St. J; Tegopoulos, J. A.; "Analysis of Squirrel Cage Induction Motors with Broken Bars and Rings," IEEE Transactions on Energy Conversion, Vol. 14, No. 4, December 1999.

Williamson, Stephen; Healey, Russell; Lloyd, Jerry; "Rotor Cage Anomalies and Unbalanced Magnetic Pull in Single-Phase Induction Motors, Part I. Analysis" and "Rotor Cage Anomalies and Unbalanced Magnetic Pull in Single-Phase Induction Motors, Part II, Experimental and Theoretical Studies." Cambridge University Engineering Department, and Advanced Motor Development Center, Emerson Electric Company.

Koch, Brian; Spee, Rene; "A Comparison of Stack Preparation Methods for Bar Insulation in Diecast Rotors," IEEE Industry Applications Society Annual Meeting, New Orleans, LA, Oct. 5-9, 1997.

Williamson, Stephen; Boger, Michael; "Impact of Inter-Bar Currents on the Performance of the Brushless Doubly-Fed Motor," IEEE Industry Applications Society Annual Meeting, New Orleans, LA, October 1997.

Fiser, R; Ferkolj, S; Soline, H; "Steady State Analysis of Induction Motor with Broken Rotor Bars," Laboratory for Electromotors Drives, Slovenia; Electrical Machines and Drives, Conference Publication No. 412, Sep. 11-13, 1995.

Zhang, Zhengping; Ren, Zhen; Huang, Wenying; "A Novel Detection Method of Motor Broken Rotor Bars Based on Wavelet Ridge." Guangdong Power and Test Research Institute, The Electric Power College, South China University of Technology.

Henao, H; Capolino, G. A.; Razik, H., "Analytical Approach of the Stator Current Frequency Harmonics Computation for Detection of Induction Machine Rotor Faults," SDEMPED 2003, Atlanta, GA, August 2003.

Meshgin-Kelk, H.; Milimonfared, J; Toliyat, H. A.; "Interbar Currents and Axial Fluxes in Healthy and Faulty Induction," IEEE 2002, 0-7803-7420-7/02., Department of Electrical Engineering, Amir-Kabir University of Technology and Texas A & M University.

Yazidi, Amine; Henao, Humberto; Capolino, Gerard-Andre; "Broken Rotor Bars Fault Detection in Squirrel Cage Induction Machines," Department of Electrical Engineering, University of Picardie, France, 0-7803-8987-5/05.

Watson, J. F.; Paterson, N. C.; "Improved Techniques for Rotor Fault Detection in Three-Phase Induction Motors," School of Electronic and Electrical Engineering, Aberdeen U.K.; 0-7803-4943-1/98.

Mirafzal, Behrooz; Demerdash, A. O.; "Effects of Load on Diagnosing Broken Bar Faults in Induction Motors Using the Pendulous Oscillation of the Rotor Magnetic Field Orientation," Deparatment of Electrical and computer Engineering, Marquette University; 0-7803-8486-5/04.

Yazici, Birsen; Kliman, Gerald; "An Adaptive Statistical Time-Frequency Method for Detection of Broken Bars and Bearing Faults in Motors Using Stator Current," 0093-9994/99; 1999 IEEE Transactions on Industry Applications, Vol. 35, No. 2, March/April 1999.

Drif, M'Hamed; Benouzza, N; Kraloua, B; Bendiabdellah, A; Dente, J. A.; "Squirrel Cage Rotor Faults Detection in Induction Motor Utilizing Stator Power Spectrum Approach," Power Electronics, Machines and Drives, April 2002, Conference Publication No. 487.

Hurst, K. D.; Habetler, T. G.; Griva, G; Profumo, F; "Speed Sensorless Field-Oriented Control of Induction Machines Using Current Harmonic Spectral Estimation," 0-7803-1993-1/94.

Hurst, K. D.; Habetler; "A Comparison of Spectrum Estimation Techniques for Sensorless Speed Detection in Induction Machines," 0-7803-3008-0/95, 1995 IEEE, Georgia Institute of Technology, School of Electrical Engineering.

Brudny, J. F.; Roger, D; "Induction Machine Speed Sensor Based on Stator Current Measurement," Power Electronics and Variable Speed Drives, Conference Publication No. 429, September 1996.

Pillay, P; Xu, Z; "Motor Current Signature Analysis," Clarkson University, ECE Dept., Potsdam, NY; 0-7803-3544-9/96.

Nandi, S; Ahmed, S; Toliyat, H. A.; Bharadwaj, R; "Selection Criteria of Induction Machines for Speed - sensorless Drive Applications," 0-7803-7116-X/01.

Ferrah, A; Hogben-Laing, P. J.; Bradley, K. J.; Asher, G. M.; Woolfson, J. S.; "The Effect of Rotor Design on Sensorless Speed Estimation Using Rotor Slot Harmonics Identified by Adaptive Digital Filtering Using The Maximum Likelihood Approach," IEEE IAS Annual Meeting, New Orleans, 1997.

Hsu, John; "Monitoring of Defects in Induction Motors Through Air-Gap Torque Observation," IEEE Transactions on Industry Applications, Vol. 31, No. 5, September/October 1995.

Benbouzid, Mohamed El Hachemi; "A Review of Induction Motors Signature Analysis as a Medium for Faults Detection," IEEE Transactions on Industrial Electronics, Vol. 47, No. 5, October 2000.

III. NON-PATENT LITERATURE DOCUMENTS

Thorsen, O. V.; Dalva, M; "Failure Identification and Analysis for High Voltage Induction Motors in Petrochemical Industry," Bergen College, Norway; 0-7803-4943-1/98 1998 IEEE.

Schoen, Randy; Lin, Brian; Habetler, Thomas; Schlag, Jay; Farag, Samir; "An Unsupervised, On-Line System for Induction Motor Fault Detection Using Stator Current Monitoring," IEEE Transactions on Industry Applications, Vol. 31, No. 6, November/December 1995.

Barbour, A; Thomson, W. T.; "Finite Element Study of Rotor Slot Designs with Respect to Current Monitoring for Detecting Static Airgap Eccentricity in Squirrel-Cage Induction Motors," IEEE Industrial Applications Society Annual meeting, New Orleans, LA October 1997.

Dorrell, D. G.; Thomson, W. T.; Roach, S; "Analysis of Airgap Flux, Current and Vibration Signals as a Function of the Combination of Static and Dynamic Airgap Eccentricity in 3-Phase Induction Motors," The Robert Gordon University, Aberdeen, UK, 0-7803-3008-0/95.

Barbour, A; Thomson, W. T.; "Finite Element Analysis and On-line Current Monitoring to Diagnose Airgap Eccentricity in 3-Phase Induction Motors," The Robert Gordon University, Aberdeen.

"IEEE Guide for Diagnostic Field Testing of Electric Power Apparatus - Electrical Machinery," IEEE Std 62.2 2004; June 2005.

Nandi, Subhasis; Toliyat, Hamid; Parlos, Alexander; "Performance Analysis of a Single Phase Induction Motor Under Eccentric Conditions" IEEE Industry Applications Society Annual Meeting, New Orleans, LA October 1997.

Toliya, H. A.; Arefeen, M. S.; Parlos, A. G.; "A Method for Dynamic Simulation and Detection of Air-Gap Eccentricity in Induction Machines" Texas A & M University Department of Electrical Engineering and Department of Nuclear Engineering; 0-7803-3008-0/95.

Dorrell, D. G.; Thomson, W. T.; Roach, S; "Combined Effects of Static and Dynamic Eccentricity on Airgap Flux Waves and the Application of Current Monitoring to Detect Dynamic Eccentricity in 3-Phase Induction Motors," Electrical Machines and Drives, Conference Publication No. 412, September 1995.

Ho, S. L.; Lau, K. M.; "Detection of Faults in Induction Motors Using Artificial Neural Networks," Electrical Machines and Drives, Conference Publication No. 412, September 1995.

Riley, Caryn; Lin, Brian; Habetler, Thomas; Schoen, Randy; "A Method for Sensorless On-Line Vibration Monitoring of Induction Machines," Georgia Institute of Technology, 0-7803-4067-1/97, 1997 IEEE.

"IEEE Standard Test Procedure for Polyphase Induction Motors and Generators," IEEE Std 112 - 2004; Nov. 4, 2004.

"Energy Management for Motor Driven Systems" Office of Industrial Technologies, Department of Energy, U.S.A.

"The Repair of Induction Motors, Best Practices to Maintain Energy Efficiency" Association of Electrical and Mechanical Trades Shea, John J., "Conditions for Series Arcing Phenomena in PVC Wiring" 0-7803-9113-6/05/$20.00 ©2005 IEEE Kang, Dong-Sik, "Experience of Thermal Evaluation & Insulation Diagnosis Techniques for Rotating Machines" KERI Industry Application Research Center, Korea Electrotechnology Research Institute, July/2008

"Testing of Squirrel Cage Rotors" Reliable Solutions Today, Tech Note No. 23 TN23-1 (updated - October 2003)

Almand, Dave, "Fault Zone Analysis 'Power Circuit'" PdMA Corporation, Department of Technical Support & Training Sletbak, Jarle, "Glowing Contact Areas in Loose Copper Wire Connections" IEEE Transactions on Components, Hybrids, and Manufacturing Technology, Vol. 15, No. 3, June 1992, 0148-6411/92/$03.00 ©1992 IEEE "Eliminate Excessive In-Plant Distribution System Voltage Drops" Industrial Technologies Program, Motor Systems Tip Sheet #8 - September 2005, U.S. Department of Energy "Optimizing Your Motor-Driven System" Fact Sheet, a Program of the U.S. Department of Energy, Motor Challenge "Electric Motor Predictive and Preventive Maintenance Guide" Report Summary, Electric Power Research Institute, EPRI NP-7502s "Guidelines for Maintaining Motor Efficiency During Rebuilding" Reliable Solutions Today, Tech Note No. 16 (Revised) Originally Published May 1992, revised September 1999

Christensen, Preben, "Stator Core Testing" Reliable Solutions Today, Tech Note, No. 17 (update - March 1997) TN17-1

"The Effect of Repair/Rewinding on Motor Efficiency" EASA/AEMT Rewind Study and Good Practice Guide to Maintain Motor Efficiency "Troubleshooting of Electric Motors" EPRI Technical Report NMAC Jangho, Yoon and Wiedenbrug, Ernesto "Automated Monitoring of High-Resistance Connections in The Electrical Distribution System of Industrial Facilities" Department of Electrical Engineering, Korea University, Seoul, Korea and Baker Instrument Company, Fort Collins, CO, U.S.A.

Bockstette, Jens, "Upstream Impedance Diagnostic for Three-Phase Induction Motors" 1-4244-1062-2/07/$25.00 © 2007 IEEE Lee, Sang Bin, "Experimental Study of Inter-Laminar Core Fault Detection Techniques Based on Low Flux Core Excitation" 0885-8969/$20.00 © 2006 IEEE Transactions on

III. NON-PATENT LITERATURE DOCUMENTS

Energy Conversion Vol. 21, No. 1 March 2006
Kliman, Gerald B, "A New Method for Synchronous Generator Core Quality Evaluation" 0885-8969/04$20.00 © 2004 IEEE Transactions on Energy Conversion, Vol. 19 No. 3 September 2004
IEEE Xplore# Search Result - Microsoft Internet Explorer
Lee, Sang Bin, "Detection and Classification of Stator Turn Fault and High Resistance Electrical Connections for Induction Machines" Department of Electrical Engineering, Korea University, Seoul, Korea
Lee, Sang Bin, "On-line Detection of High-Resistance Connections in the Incoming Electrical Circuit for Induction Motors" Department of Electrical Engineering, Korea University, Seoul, Korea
Lee, Sang Bin and Wiedenbrug, "A Stator Core Quality Assessment Technique for Inverter-fed Induction Machines" Department of Electrical Engineering, Korea University, Seoul, Korea and Baker Instrument Company, Fort Collins, CO, U.S.A.
"Sensorlose Stabbruchdetektierung in Kaefiglaeufermaschinen mittels Neuronaler Netze", J. Blattner, ICMA Mechatronic Systeme Shaker Verlag, Band 3, 1997
"Motor circuit analysis: Theory, application and energy analysis", H. F. Penrose, 2002, ISBN: 0-9712450-0-2.
"Machinery Vibration Measurement and Analysis", V. Wowk, McGraw Hill, 1997, ISBN-10: 0-07-071936-5.
"The simplified handbook of vibration analysis Volume two", A. Crawford, Computational Systems, Inc. Library of Congress Catalog Card number 92-72682, 1992.
"Analysis II - Concentrated vibration signature analysis and related condition monitoring techniques", Technical Associates of Charlotte, P. C., Feb. 10-13, 1998.
"Analysis of the fatigue causes on the rotor bars of squirrel cage asynchronous motors", C. Rojas, M. Melero, M. Cabanas, M. Donision, M. Eteve, J. Vina Olay, A Arguelles Amado, IEEE SDEMPED 2001.
"Influence of inertia on general effects of faulty rotor bars and the Vienna monitoring method", c. Kral, F. Pirker, G. Pascoli, IEEE SDEMPED 2001.
"Analysis by the Finite Element Method of the influence caused in the current distribution in rotor squirrel-cage IM and current spectrum by the number and distribution of faulty bars during a rotor failure", C. Rojas, M. Melero, M. Cabanas, G. Orcajo, M. Donision, J. Solares, IEEE SDEMPED 2001.
"Assymetry Factors of Induction Motor Rotor Cages", T. Sobczyk, W. Maciolek, IEEE SDEMPED 2001.
"The integration of Machine Fault Detection into an Indirect Field Oriented Induction Machine Drive Control Scheme The Vienna Monitoring Method", R. Wieser, M. Schagginger, C. Kral, F. Pirker, IEEE IAS Annual Meeting 1999.
"Detection of Mechanical Imbalances without Frequency Analysis", C. Kral, T. Habetler, R. Harley, IEEE SDEMPED 2003.
"The use of phase current analysis to detect faults in squirrel cage induction motors onboard military warships", D. Ranking, G. Watt, D. Brown, D. Powell, IEE EMD97.
"Comparative Investigation of Diagnostic Media for Induction Motors: A Case of Rotor Cage Faults", A. Trzynadlowski, E. Ritchie, IEEE Transactions on inductrial electronics, Vol. 47, No. 5, 2000.
"The effects of broken rotor bars on the transient run up of induction machines", J. Penman, A. Stavrou, IEE EMD95.
"Broken Bar detection in dincuction machines: Comparison between current spectrum approach and parameter estimation approach", F. Filippetti, G. Franceschini, C. Tassoni, P. Vas, IEEE 0-7803-1993-1/94, 1994.
"Asymptotic Wavelet and Gabor Analysis: Extraction of Instantaneous Frequencies", N. Delprat, B. Escudie, P. Guillemain, R. Kronland-Martinet, P. Tchamitchian, B. Torresani, IEEE Transactions on Information Theory, Vol. 38, No. 2, 1992.
"Characterisation of Signals by the ridges of their Wavelet Transforms", R. Carmona, W. Hwang, B. Torresani, IEEE Transactions on Signal Processing, Vol. 45, No. 10.
"The current analysis program - a software tool for rotor fault detection in three phase induction motors", R. Brunett, J. Watson, IEE EMD95.
"Interbar currents and axial fluxes in healthy and faulty induction motors", H. Meshgin-Kelk, J. Milimonfared, H. Toliyat, IEEE 0-7803-7420-7/02.
"Broken Rotor Bars Fault Detection in Squirrel Cage Inductioni Machines", A. Yazidi, H. Henao, G. Capolino, IEEE 0-7803-8987-5/05, 2005.
"Effects of load on diagnosing broken bar faults in induction motors using the pendulous oscillation of the rotor magnetic field orientation", B. Mirafzal, N. Demerdash, IEEE IAS 2004.
"Broken Rotor-Bar detection in induction machines", S. Stefanko, I. Kurtovic, M. Bogut, M. Kovacevic, M. Momic, IEEE SDEMPED 2001.
"Pattern recognition - a technique for induction machines rotor fault detection 'Broken Bar fault'", M. Haji, H. Toliyat, IEEE IEMDC 2001.
"Broken Bars diagnosis of 3600 rpm 750 kW induction motor comparison Modelization and measurement of phase currents", L. Baghli, H. Razik, A. Rezzoug, C. Caironi, L. Durantay, M. Adkim, IEEE SDEMPED 2001.
"Induction machine steady state speed extraction by analysis of stator current signatures", E. Wiedenbrug, A. Wallace, IEEE EMCW 1998.
"A comparison of rotor slot harmonic speed measurement algorithms in the case of not stationary speed signals", M. Aiello, A. Cataliotti, S. Nuccio, IEEE SDEMPED 2001.
"Limitations of model-based methods for electric machine condition monitoring", R. Tallam, T. Habetler, R. Harley, IEEE SDEMPED 2001.

| III. NON-PATENT LITERATURE DOCUMENTS |
| --- |
| "Hierarchical procedure for the diagnostics of electromechanical system fault", A. Cavallini, F. Filipetti, IEEE SDEMPED 2001.<br>"Is finding broken rotor bars so easy?", R. Nailen, EASA April 1998.<br>"Are those new motor maintenance tests really that great?", R. Nailen, EASA 2000.<br>"Motor current analysis and its application in induction motor fault analysis", M. Xu, T. Alford, Predictive Maintenance Technology National Conference 1997.<br>"Recent advances in predictive maintenance", C. Nyberg, EASA Convention 2001.<br>"Sensorless detection of induction motor faults", A. Parlos, K. Kim, R. Bharadwaj, IEEE SDEMPED 2001.<br>"The use of shaft voltage to detect airgap eccentricity and shorted turns in salient pole alternators", D. Rankin, I. Wilson, IEE EMD95, 1995.<br>"A review of on-line condition monitoring techniques for three-phase squirrel-gage induction motors - past present and future", W. Thompson |

The invention claimed is:

1. A portable multiphasic induction motor or generator test device comprising:
   a portable test device containment;
   a plurality of interconnected waveform signal generators established within said portable test device containment;
   an immotive multiphasic test signal controller to which said plurality of interconnected waveform signal generators are responsive and that generates a plurality of immotive multiphasic test signals, each comprised of three signals, each of which signal is applied to a phase of said multiphasic motor or generator, wherein each of said plurality of immotive multiphasic test signals has a set phase combination of said three signals that does not cause motion of movement elements of a multiphasic motor or generator, and wherein said plurality of immotive multiphasic test signals generated by said immotive multiphasic test signal controller comprise:
      a first immotive multiphasic test signal having a first phase,
      a second immotive multiphasic test signal having a second phase 180° off of said first phase,
      a plurality of successively, angular location incremented first and second immotive multiphasic test signals having successive phases incremented off of said first and second immotive multiphasic test signals,
   a multiphasic motive force electrical machine fault analyzer that conducts mathematical analysis to discern the existence of an anomaly in said multiphasic induction motor or generator and provide an indication to cause, if needed, repair or replacement of said anomaly in said multiphasic induction motor or generator based on the results of said analysis;
   test containment supply circuitry responsive to said immotive multiphasic test signal controller; and
   a detachable electrical power connectivity issuing from said portable test device containment and electrically connected to said test containment supply circuitry.

2. A portable multiphasic induction motor or generator test device as described in claim 1 and further comprising:
   a multiphasic motive force electrical machine response sensor element;
   a sensor return connected to said multiphasic motive force electrical machine response sensor element;
   and wherein said multiphasic motive force electrical machine fault analyzer is responsive to said sensor element and configured to assess the existence of a fault in said multiphasic induction motor or generator.

3. A portable multiphasic induction motor or generator test device as described in claim 2 wherein said a plurality of interconnected waveform signal generators established within said portable test device containment comprises a plurality of multiphasic motive force electrical machine signal generators.

4. A portable multiphasic induction motor or generator test device as described in claim 1 wherein said immotive multiphasic test signal controller to which said plurality of interconnected waveform signal generators are responsive comprises an immotive multiphasic test signal variation controller.

5. A portable multiphasic induction motor or generator test device as described in claim 4 wherein said wherein said immotive multiphasic test signal controller to which said plurality of interconnected waveform signal generators are responsive comprises an immotive multiphasic test signal reapplication controller, and wherein said multiphasic motive force electrical machine analyzer is configured to assess the existence of a fault in said multiphasic induction motor or generator.

6. A portable multiphasic induction motor or generator device as described in claim 4 wherein said immotive multiphasic test signal variation controller comprises an immotive multiphasic test signal variation controller selected from a group consisting of:
   an immotive multiphasic test signal voltage variation controller;
   an immotive multiphasic test signal current variation controller;
   an immotive multiphasic test signal magnitude variation controller;
   an immotive multiphasic test signal relative amplitude variation controller;
   an immotive multiphasic test signal frequency variation controller;
   all permutations and combination of the above.

7. A portable multiphasic induction motor or generator test device as described in claim 1 wherein said a plurality of interconnected waveform signal generators established within said portable test device containment comprises an interconnected waveform signal generators selected from a group consisting of:
   a sinusoidal waveform immotive multiphasic test signal generator;
   a multiple frequency immotive multiphasic test signal generator;
   a frequency sweep immotive multiphasic test signal generator;
   a sawtooth waveform immotive multiphasic test signal generator;

a fourier transform determinate waveform immotive multiphasic test signal generator;
all permutations and combination of the above.

8. A portable multiphasic induction motor or generator test device as described in claim 1 wherein said an immotive multiphasic test signal controller to which said plurality of interconnected waveform signal generators are responsive comprises an immotive multiphasic test signal frequency variation controller.

9. A portable multiphasic induction motor or generator test device as described in claim 8 wherein said a plurality of interconnected waveform signal generators established within said portable test device containment comprises an interconnected waveform signal generators selected from a group consisting of:
an about ¼ Hz immotive multiphasic test waveform signal generator;
an about 10 Hz immotive multiphasic test waveform signal generator;
an about 500 Hz immotive multiphasic test waveform signal generator;
an about 1000 Hz immotive multiphasic test waveform signal generator;
a sub-hertz immotive multiphasic test waveform signal generator;
a high and low frequency immotive multiphasic test waveform signal generator;
a superimposed high and low frequency immotive multiphasic test waveform signal generator;
a plurality of different frequency immotive multiphasic test waveform signals generator;
a superimposed immotive multiphasic test waveform signal and movement signal generator;
a variable depth immotive multiphasic test waveform signal generator;
a rotor component immotive multiphasic test waveform signal generator;
a stator component immotive multiphasic test waveform signal generator;
a first component optimized immotive multiphasic test waveform signal generator;
a second component optimized immotive multiphasic test waveform signal generator;
a first effect indicative immotive multiphasic test waveform signal generator;
a second effect indicative immotive multiphasic test waveform signal generator;
a depth effect indicative immotive multiphasic test waveform signal generator;
all permutations and combination of the above.

10. A portable multiphasic induction motor or generator test device as described in claim 1 wherein said immotive multiphasic test signal controller to which said plurality of interconnected waveform signal generators are responsive comprises an immotive multiphasic test signal amplitude variation controller.

11. A portable multiphasic induction motor or generator test device as described in claim 10 wherein said immotive multiphasic test signal amplitude variation controller comprises an immotive multiphasic test signal relative amplitude variation controller.

12. A portable multiphasic induction motor or generator test device as described in claim 10 wherein said immotive multiphasic test signal amplitude variation controller comprises an immotive multiphasic test signal magnetic field intensity factor variation controller.

13. A portable multiphasic induction motor or generator test device as described in claim 12 wherein said immotive multiphasic test signal magnetic field intensity factor variation controller comprises an immotive multiphasic test signal magnetic field intensity factor variation controller selected from a group consisting of:
an about 0.33 tesla factor immotive multiphasic test signal magnetic field intensity factor variation controller;
an about 0.50 tesla factor immotive multiphasic test signal magnetic field intensity factor variation controller;
an about 0.67 tesla factor immotive multiphasic test signal magnetic field intensity factor variation controller;
an about one tesla factor immotive multiphasic test signal magnetic field intensity factor variation controller;
an about 1.33 tesla factor immotive multiphasic test signal magnetic field intensity factor variation controller;
all permutations and combination of the above.

14. A method of testing for a rotor conductivity anomaly in a multiphasic induction motor or generator comprising the steps of:
accepting a multiphasic induction motor or generator assembled in a working environment;
positioning a portable test device proximate to an electrical supply for said multiphasic induction motor or generator;
detachably electrically connecting said portable test device to said electrical supply for said multiphasic induction motor or generator;
establishing movement elements of said multiphasic induction motor or generator in a stationary state;
generating a plurality of immotive multiphasic test signals, each comprised of three signals, each of which signal is applied to a phase of said multiphasic motor or generator from said portable test device, wherein each of said three signals has a set phase combination that does not cause motion of said movement elements of said multiphasic motor or generator, said plurality of immotive multiphasic test signals comprising:
a first immotive multiphasic test signal having a first phase;
a second immotive multiphasic test signal having a second phase 180° off of said first phase;
a plurality of successively, angular location incremented first and second immotive multiphasic test signals having successive phases incremented off of said first and second immotive multiphasic test signals;
applying said plurality of immotive multiphasic test signals to at least a portion of said electrical supply for said multiphasic induction motor or generator; and
sensing responses of said induction motor or generator to said plurality of immotive multiphasic test signals by at least one sensor element, that senses the responses of said multiphasic motor or generator to each of said plurality of immotive multiphasic test signals when applied to each phase of said multiphasic motor or generator in said phase combination, and that provides a sensor test signal response output;
conducting analysis of said sensor test signal response output to discern the existence of a rotor conductivity anomaly from said response of said multiphasic induction motor or generator to said plurality of immotive multiphasic test signals; and
providing an indication to cause, if needed, repair or replacement of said rotor conductivity anomaly in said multiphasic induction motor or generator as a result of said analysis.

15. A method of testing for a rotor conductivity anomaly in a multiphasic induction motor or generator as described in claim 14 wherein said step of conducting mathematical analysis to discern the existence of a rotor conductivity anomaly from said response of said multiphasic induction motor or generator to said immotive multiphasic test signal comprises the step of discerning the existence of a rotobar fault.

16. A method of testing for a rotor conductivity anomaly in a multiphasic induction motor or generator as described in claim 14 wherein said step of conducting mathematical analysis to discern the existence of a rotor conductivity anomaly from said response of said multiphasic induction motor or generator to said immotive multiphasic test signal comprises the step of discerning the existence of a frequency variation effect.

17. A method of testing for a rotor conductivity anomaly in a multiphasic induction motor or generator as described in claim 16 wherein said step of discerning the existence of a frequency variation effect comprises the step of discerning the existence of an effect that decreases with increasing frequency test signals.

18. A method of testing for a rotor conductivity anomaly in a multiphasic induction motor or generator as described in claim 15 and further comprising the step of assessing the existence of a rotobar fault depth indicia.

19. A method of testing for a rotor conductivity anomaly in a multiphasic induction motor or generator as described in claim 14 wherein said step of conducting mathematical analysis to discern the existence of a rotor conductivity anomaly from said response of said multiphasic induction motor or generator to said immotive multiphasic test signal comprises the step of discerning the existence of a rotor conductivity anomaly selected from a group consisting of:
- discerning the existence of a rotor resistance anomaly;
- discerning the existence of a rotor circuit resistance anomaly;
- discerning the existence of a motor brush imbalance anomaly;
- discerning the existence of a motor diode bridge anomaly; and
- all permutations and combination of the above.

20. A method of testing for a rotor conductivity anomaly in a multiphasic induction motor or generator as described in claim 14 wherein said step of conducting mathematical analysis to discern the existence of a rotor conductivity anomaly from said response of said multiphasic induction motor or generator to said immotive multiphasic test signal comprises the step of discerning the existence of a locational variation effect.

21. A method for multiphasic induction motor or generator testing as described claim 14 and further comprising the step of discerning the existence of a stator magnetization core fault from said response of said multiphasic induction motor or generator to said immotive multiphasic test signal.

22. A method for multiphasic induction motor or generator testing as described in claim 21 wherein said step of discerning the existence of a stator magnetization core fault from said response of said multiphasic induction motor or generator to said immotive multiphasic test signal comprises the step of discerning the existence of a frequency variation effect.

23. A method for multiphasic induction motor or generator testing as described in claim 22 wherein said step of discerning the existence of a frequency variation effect comprises the step of discerning the existence of a substantially frequency squared proportional effect.

24. A method for multiphasic induction motor or generator testing as described in claim 14 and further comprising the step of discerning the existence of a rotational eccentricity fault for said multiphasic induction motor or generator from said response to said immotive multiphasic test signal.

25. A method for multiphasic induction motor or generator testing as described in claim 24 wherein said step of discerning the existence of a rotational eccentricity fault for said multiphasic induction motor or generator from said response to said immotive multiphasic test signal comprises the step of discerning the existence of a frequency variation effect.

26. A method for multiphasic induction motor or generator testing as described in claim 25 wherein said step of discerning the existence of a rotational eccentricity fault for said multiphasic induction motor or generator from said response to said immotive multiphasic test signal further comprises the step of discerning the existence of a locational variation effect.

27. A method for multiphasic induction motor or generator testing as described in claim 25 wherein said step of discerning the existence of a frequency variation effect comprises the step of discerning the existence of an effect that increases with increasing frequency test signals.

* * * * *